US012677559B2

(12) United States Patent
Park et al.

(10) Patent No.: US 12,677,559 B2
(45) Date of Patent: Jul. 7, 2026

(54) DISPLAY APPARATUS

(71) Applicant: Samsung Display Co., Ltd., Yongin-Si (KR)

(72) Inventors: Junhyun Park, Yongin-si (KR); Cheolgon Lee, Yongin-si (KR); Mukyung Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/037,295

(22) Filed: Jan. 27, 2025

(65) Prior Publication Data

US 2025/0393418 A1 Dec. 25, 2025

(30) Foreign Application Priority Data

Jun. 19, 2024 (KR) ........................ 10-2024-0079796

(51) Int. Cl.
H10K 59/131 (2023.01)
G09G 3/3233 (2016.01)

(52) U.S. Cl.
CPC ......... H10K 59/131 (2023.02); G09G 3/3233 (2013.01); G09G 2300/0426 (2013.01); G09G 2300/0842 (2013.01); G09G 2310/08 (2013.01); G09G 2330/021 (2013.01)

(58) Field of Classification Search
CPC ...... H10K 59/00–95; G06F 3/041–047; G06F 2203/041–4114
See application file for complete search history.

(56) References Cited

U.S. PATENT DOCUMENTS

| | | | |
|---|---|---|---|
| 9,552,774 B2 | 1/2017 | Jeong et al. | |
| 11,402,714 B2 | 8/2022 | Yuan et al. | |
| 11,935,453 B2 | 3/2024 | Park et al. | |
| 2018/0040278 A1* | 2/2018 | Chu | H10K 59/124 |
| 2020/0020296 A1* | 1/2020 | Kim | G09G 3/3648 |
| 2022/0036832 A1* | 2/2022 | Lim | G09G 3/3291 |

FOREIGN PATENT DOCUMENTS

| | | | | |
|---|---|---|---|---|
| CN | 108594554 B | 11/2020 | | |
| KR | 20090090117 A | * 8/2009 | .......... | G09G 3/3275 |
| KR | 10-2071566 B1 | 3/2020 | | |
| KR | 10-2022-0156147 A | 11/2022 | | |

* cited by examiner

*Primary Examiner* — Sanjiv D. Patel
(74) *Attorney, Agent, or Firm* — Innovation Counsel LLP

(57) ABSTRACT
A display apparatus that consumes less power and has a small size bezel is provided, including a substrate, a plurality of subpixel groups arranged on the substrate and including a first subpixel group including first subpixels and a second subpixel group including second subpixels, a first data line configured to transmit a first data signal to the first subpixel group, a second data line configured to transmit the first data signal to the second subpixel group, and a first switch electrically connected to the first data line and configured to selectively transmit the first data signal to the first data line.

16 Claims, 19 Drawing Sheets

DISPLAY APPARATUS

CROSS-REFERENCE TO RELATED APPLICATION

This application is based on and claims priority under 35 U.S.C. § 119 to Korean Patent Application No. 10-2024-0079796, filed on Jun. 19, 2024, in the Korean Intellectual Property Office, the disclosure of which is incorporated by reference herein in its entirety.

BACKGROUND

1. Field

One or more embodiments relate to display apparatuses, and more particularly, to a display apparatus that consumes a small amount of power and has a small bezel.

2. Description of the Related Art

Display apparatuses receive information about an image and display the image. Such display apparatuses are used as displays for small products, such as mobile phones, or for large products, such as televisions.

Display apparatuses include a plurality of pixels that receive electrical signals and emit light to display an image to the outside. Each of the plurality of pixels includes a light-emitting device. For example, in the case of organic light-emitting display apparatuses, each pixel includes an organic light-emitting diode as a light-emitting device. In general, organic light-emitting display apparatuses include a thin film transistor and an organic light emitting diode, which is a display element, formed on a substrate, and the organic light emitting diode self-emits light.

Research is underway to reduce power consumption of display apparatuses and make bezels of the display apparatuses thinner.

SUMMARY

One or more embodiments include a display apparatus that consumes a small amount of power and has a small bezel. However, aspects of embodiments are not limited thereto, and the above characteristics do not limit the scope of embodiments according to the disclosure.

Additional aspects will be set forth in portion in the description which follows and, in part, will be apparent from the description, or may be learned by practice of the presented embodiments of the disclosure.

According to one or more embodiments, a display apparatus includes a substrate, a plurality of subpixel groups arranged on the substrate and including a first subpixel group including first subpixels and a second subpixel group including second subpixels, a first data line configured to transmit a first data signal to the first subpixel group, a second data line configured to transmit the first data signal to the second subpixel group, and a first switch electrically connected to the first data line and configured to selectively transmit the first data signal to the first data line.

The display apparatus may further include a data driver configured to generate the first data signal, and a first output line configured to receive the first data signal from the data driver and transmit the first data signal to the first data line and the second data line.

The first switch may electrically connect the first output line to the first data line.

The first switch may be turned on or off according to a first control signal, and the first switch is turned on and the first data signal may be transmitted to the first data line.

The first data signal may include data signal A of a first section and data signal B of a second section following the first section.

The first switch is turned on, and the first data signal may be transmitted to the first data line.

The first switch is turned off, and the first data signal may not be transmitted to the first data line.

The first output line and the second data line may be directly connected to each other, and the first data signal may be completely transmitted from the first output line to the second data line.

Each of the second subpixels may be electrically connected to a storage capacitor, and the first data signal may be written to the storage capacitor.

The data signal B may be written to the storage capacitor after the data signal A is written to the storage capacitor.

The data signal B may be measured from the storage capacitor.

A signal measured from the storage capacitor in the first section may be the data signal A.

A signal measured from the storage capacitor in the second section following the first section may be the data signal B.

The plurality of subpixel groups may further include a third subpixel group including third subpixels and a fourth subpixel group including fourth subpixels, and the display apparatus may include a third data line configured to transmit a second data signal to the third subpixel group, a fourth data line configured to transmit the second data signal to the fourth subpixel group, and a second switch electrically connected to the third data line.

The display apparatus may further include a data driver configured to generate the second data signal, and a second output line configured to receive the second data signal from the data driver and transmit the second data signal to the third data line and the fourth data line.

The second switch may electrically connect the second output line to the third data line.

The second switch may be turned on or off according to a first control signal, and the second switch is turned on and the second data signal may be transmitted to the third data line.

The second data signal may be completely transmitted to the fourth data line.

The substrate may include a display area and a peripheral area around the display area, and the peripheral area may include an area where the second data line and the third data line intersect each other in a plan view.

The display apparatus may further include a first shielding layer located in the area, overlapping the second data line and the third data line when viewed vertically from the substrate, and arranged between the second data line and the third data line in a cross-sectional view.

BRIEF DESCRIPTION OF THE DRAWINGS

The above and other aspects, features, and advantages of certain embodiments of the disclosure will be more apparent from the following description taken in conjunction with the accompanying drawings.

FIG. 4 is a schematic plan view of the display apparatus of FIG. 1.

FIG. 5 is a schematic cross-sectional view taken along line I-I' of FIG. 1.

FIG. 11 is a schematic cross-sectional view taken along the line I-I' of FIG. 1.

DETAILED DESCRIPTION

Figure 1:
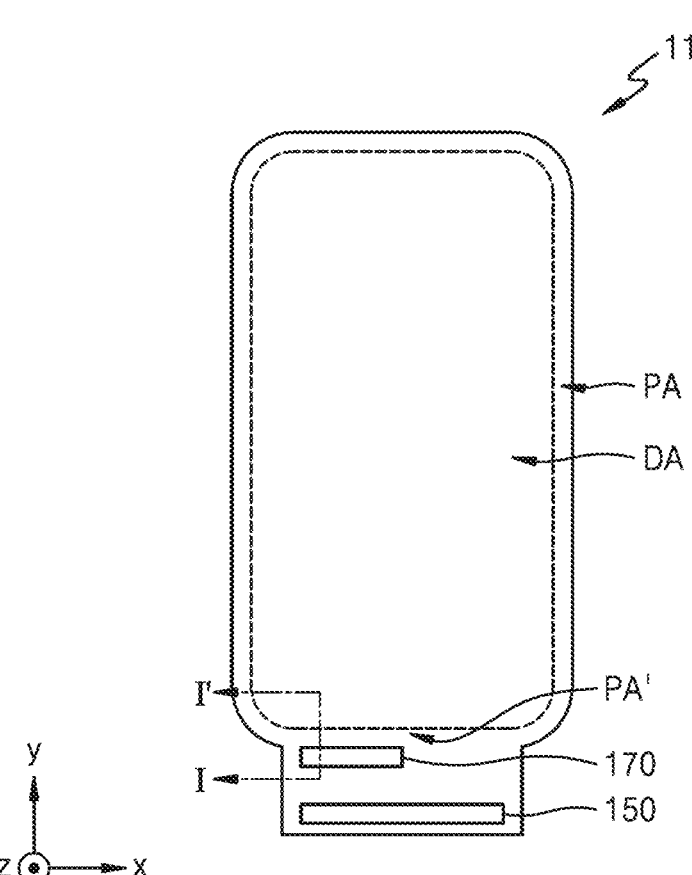
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Hereinafter, effects and features of the disclosure and a method for accomplishing them will be described more fully with reference to the accompanying drawings, in which embodiments of the disclosure are shown. The disclosure may, however, be embodied in many different forms and should not be construed as limited to the embodiments set forth herein.

One or more embodiments will be described below in more detail with reference to the accompanying drawings. Those components that are the same as or are in correspondence with each other are rendered the same reference numeral regardless of the figure number, and redundant explanations are omitted.

It will be understood that, unless otherwise specified, when an element such as a layer, film, region or substrate is referred to as being "on" another element, it can be "directly" on the other element or intervening elements may also be present. It will be understood that, unless otherwise specified, when an element such as a layer, film, region or substrate is referred to as being "below" another element, it can be "directly" below the other element or intervening elements may also be present.

In the drawings, the thicknesses of layers and regions are exaggerated or reduced for convenience of explanation. For example, since sizes and thicknesses of components in the drawings are arbitrarily illustrated for convenience of explanation, embodiments are not limited thereto. That is, for convenience of explanation, sizes, thicknesses, and ratios of components in the drawings may be exaggerated and/or simplified for clarity. Accordingly, spatially relative terms such as "beneath", "below", "lower", "under", "above", and "upper" may be used to easily describe one element or feature's relationship with another element or feature.

In the specification, it will be understood that terms used to describe spaces, directions, etc. are intended to encompass different directions or viewpoints in addition to the spaces or directions shown in the drawings. For example, when a device or a component in the drawings is turned over, the device or component described as "below" may be otherwise oriented (e.g., rotated by 90 degrees or the opposite direction). For example, when a device or a component in the drawings is turned over, the device or component described as "above" may be otherwise oriented (e.g., rotated by 90 degrees or the opposite direction). Accordingly, the terms "below" and "above" may include both orientations of above and below. In addition, a device or a component may be otherwise oriented and descriptions according to spaces or directions used herein should be interpreted in various ways.

In the specification, a process order or a method order in the description of a process or manufacturing method may be different from the described order. For example, two consecutively described processes or methods may be performed substantially at the same time or performed in an order opposite to the described order.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the specification, the terms "first", "second", and "third" may be used to describe specific components, and the terms "first", "second", and "third" may be used to distinguish one component from another.

When one component is referred to as "connected to" or "coupled to" another component, it may be directly connected to or coupled to the other component or one or more intervening component may be present therebetween.

Likewise, when one component is "electrically connected" to another component, the component and the other component may be directly and electrically connected, or may be indirectly and electrically connected through a conductive component.

In addition, it will be understood that when one component is referred to as being "between" two components, it is the only component located between the two components or an intervening component other than the component is located between the two components.

The terms used in the present specification are merely used to describe particular embodiments, and are not intended to limit the disclosure. The singular terms "a" and "an" used herein are intended to include the plural forms as well unless the context clearly indicates otherwise.

For example, the terms "mixing", "mixture", "mix", "comprises", "comprising", "includes", "including", "have (has)", and "having" specify the presence of the described feature, integer, step, operation, element, and/or component, but do not preclude the presence or addition of one or more other features, integers, steps, operations, elements, components, and/or groups thereof.

For example, the term "and/or" includes any and all combinations of one or more of the associated listed items. For example, the expression "A and/or B" indicates A, B, or A and B. The expression "at least one of" may be used to indicate one or more components among a plurality of components. For example, the expression "at least one of a, b, and c" or "at least one selected from the group consisting of a, b, and c" may indicate "a", "b", "c", "a, b", "b, c", "a, c", or "a, b, c".

For example, the terms such as "substantially" and "about" and similar terms are used as terms of approximation rather than terms of degree, and may be intended to account for inherent deviations in measured or calculated values that would be recognized by one of ordinary skill in the art. For example, the use of the term "may" or "can" when describing embodiments may refer to one or more embodiments disclosed in the specification.

For example, in the specification, when one layer has the "same layer structure" as another layer, it may mean that a plurality of layers included in the one layer may be included in the other layer in the same order. For example, a plurality of layers included in one layer and a plurality of layers included in another layer may include the same material and may be formed in the same order.

Electronic or electric devices and/or other related devices or components (e.g., some of various modules) according to embodiments described herein may be implemented by using any suitable hardware, firmware (e.g., application-specific integrated circuit), software, or a combination of software, firmware, and hardware. For example, various components of these devices may be formed on one integrated circuit (IC) chip or separate IC chips. Further, various components of these devices may be formed on a flexible printed circuit film, a tape carrier package (TCP), a printed circuit board (PCB), or formed on one substrate. Further, various components of these devices may be processes or threads, running on one or more processors, in one or more computing devices, executing compute program instructions, and interacting with other system components for performing various functions described herein.

The computer program instructions are stored in a memory that may be implemented in a computing device using a standard memory device such as a random-access memory (RAM). The computer program instructions may also be stored in other non-transitory computer-readable media such as a CD-ROM or a flash drive. In addition, one of ordinary skill in the art should recognize that functions of various computing devices may be combined or integrated into a single computing device or that a function of a specific computing device may be distributed across one or more other computing devices without departing from the spirit and scope of the embodiments.

A display apparatus according to an embodiment will be described in detail based on the above-described matters.

FIG. 1 is a schematic plan view of a display apparatus 11 according to an embodiment.

The display apparatus 11 according to the present embodiment may be an electronic device such as a smartphone, a mobile phone, a navigation device, a game player, a TV, a vehicle head unit, a notebook computer, a laptop computer, a tablet computer, a personal media player (PMP), or personal digital assistants (PDAs). The display apparatus 11 according to the present embodiment may be a center information displays (CID) disposed on an instrument panel, center fascia, or dashboard of automobiles, may be a room mirror display that replaces the side mirror of automobiles, or may be an electronic device disposed on the rear surface of a front seat to serve as an entertainment device for back seat passengers of automobiles. This electronic device may be flexible.

The display apparatus 11 may include a display area DA and a peripheral area PA surrounding the display area DA. When viewing the display area DA in a plan view, the display area DA may have an approximately rectangular shape. Embodiments are not limited thereto, and the display area DA may have a polygonal shape (e.g., a triangular shape, a pentagonal shape, or a hexagonal shape), a circular shape, an elliptical shape, an irregular shape. The display area DA may have a shape with round edge corners. The peripheral area PA may be a type of non-display area in which no display elements are arranged. The display area DA may be entirely surrounded by the peripheral area PA.

Pixels including various display elements, such as an organic light-emitting diode OLED (see FIGS. 2 and 3), may be arranged in the display area DA. The pixels may be arranged in any of various configurations, such as a stripe configuration, a PenTile™ configuration, and a mosaic configuration, to display an image.

The peripheral area PA may include a subarea PA'. The subarea PA', which is a portion of the peripheral area PA, may be arranged on one side of the display area DA, and may be an area where a data distribution unit 170 to be described later and/or a data driver 150 to be described later are arranged.

Figure 2:
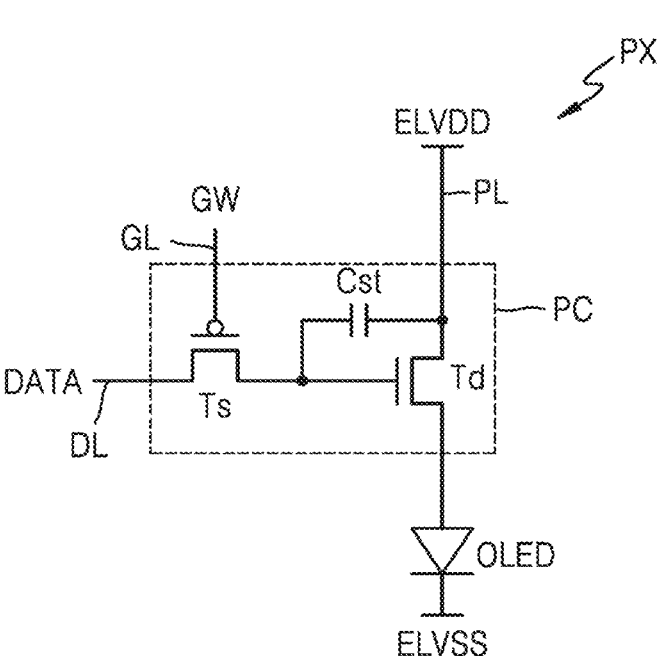
FIG. 2 is an equivalent circuit diagram of a subpixel included in a display panel of FIG. 1.

FIG. 2 is an equivalent circuit diagram of a subpixel PX included in a display panel of FIG. 1.

Referring to FIG. 2, each subpixel PX includes a pixel circuit PC connected to a gate line GL and a data line DL, and an organic light-emitting diode OLED connected to the pixel circuit PC. The gate line GL of FIG. 2 may refer to one of a plurality of gate lines GL1 through GLn of FIG. 4, which will be described later.

The pixel circuit PC includes a driving thin-film transistor Td, a switching thin-film transistor Ts, and a storage capacitor Cst. The switching thin-film transistor Ts is connected to the gate line GL and the data line DL, and transmits, to the driving thin-film transistor Td, a data signal DATA received via the data line DL according to a scan signal GW received via the gate line GL.

The storage capacitor Cst is connected to the switching thin-film transistor Ts and a driving voltage line PL, and stores a voltage corresponding to a difference between a voltage received from the switching thin-film transistor Ts and a first power supply voltage ELVDD supplied to the driving voltage line PL.

A second power supply voltage ELVSS may be a driving voltage having a relatively lower level than the first power supply voltage ELVDD. The level of the driving voltage supplied to each subpixel PX may be a difference between the level of the first power supply voltage ELVDD and the level of the second power supply voltage ELVSS.

The driving thin-film transistor Td is connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light having a certain brightness due to the driving current. For example, the driving thin-film transistor Td may be an N-MOS type transistor, and may be a source follower type transistor.

The gate signal GW may be transmitted to the switching thin-film transistor Ts along the gate line GL. The gate signal GW may be generated by the gate driving driver 130 of FIG. 4. The gate line GL may be electrically connected to a gate terminal of the switching thin-film transistor Ts.

Although a case where the pixel circuit PC includes two thin-film transistors and one storage capacitor Cst is illustrated in FIG. 2, embodiments are not limited thereto. The pixel circuit PC may include two or more storage capacitors Cst.

Figure 3:
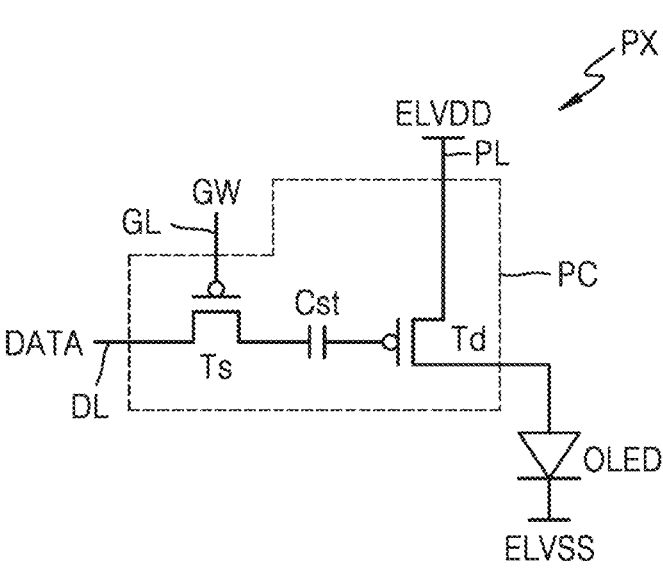
FIG. 3 is an equivalent circuit diagram of a subpixel included in the display panel of FIG. 1.

FIG. 3 is an equivalent circuit diagram of a subpixel PX included in the display panel of FIG. 1. For reference, a description of FIG. 3 that is the same as or overlaps with a description of FIG. 2 may be omitted.

Referring to FIG. 3, the driving thin-film transistor Td may be connected to the driving voltage line PL and the storage capacitor Cst, and the storage capacitor Cst may be electrically connected to the driving thin-film transistor Td and the switching thin-film transistor Ts. Unlike in FIG. 2, in the pixel circuit PC of FIG. 3, the storage capacitor Cst may not be directly connected to the driving voltage line PL. For example, the driving thin-film transistor Td may be an N-MOS type transistor or a P-MOS type transistor.

Although a case where the pixel circuit PC includes two thin-film transistors and one storage capacitor Cst is illustrated in FIG. 3, embodiments are not limited thereto. The pixel circuit PC may include two or more storage capacitors Cst.

Figure 4:
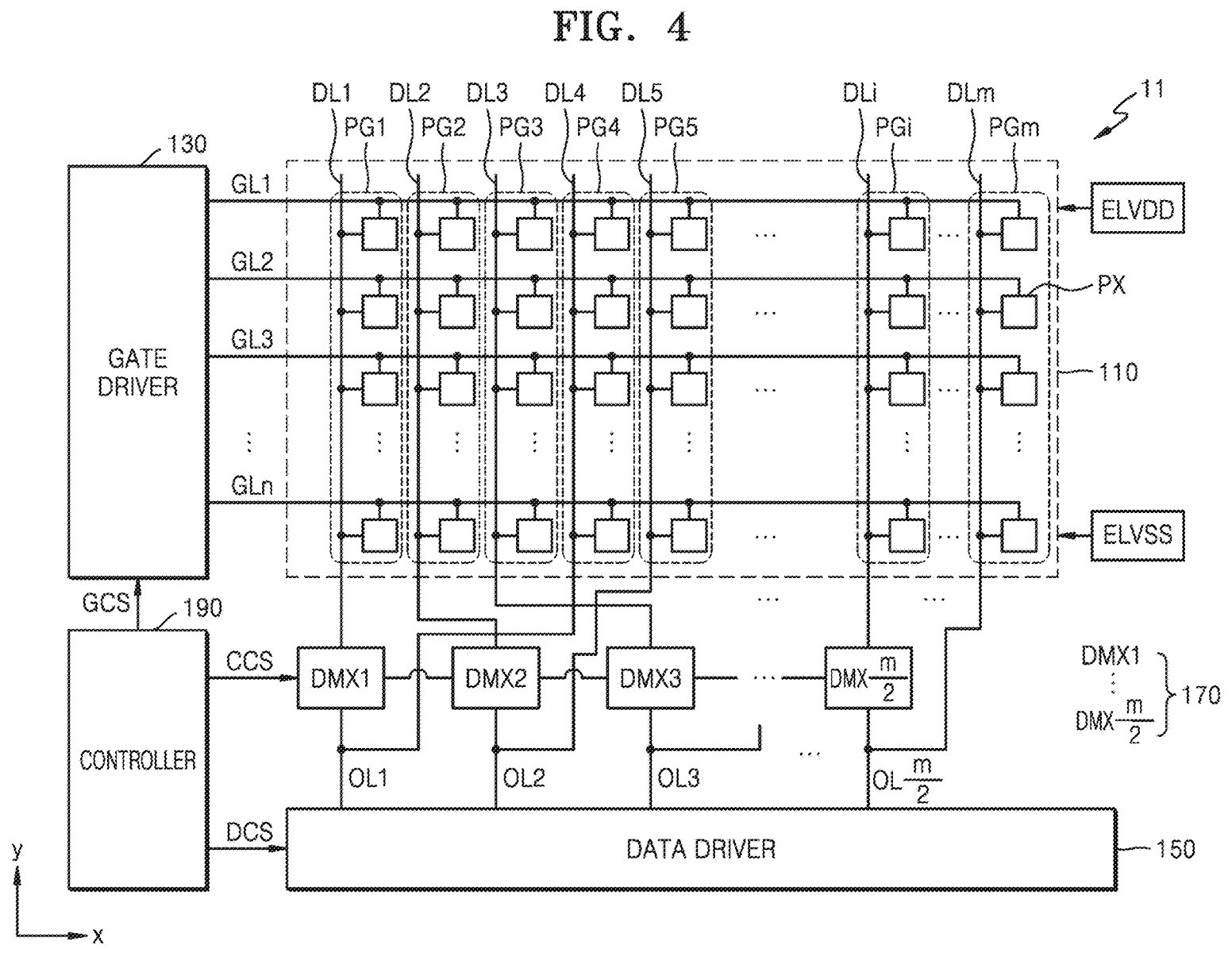

FIG. 4 is a schematic plan view of the display apparatus 11 according to an embodiment.

Referring to FIG. 4, the display apparatus 11 may include a pixel unit 110, a gate driver 130, the data driver 150, the data distribution unit 170, and a controller 190.

The pixel unit 110 in which a plurality of subpixels PX are arranged may be included in the display area DA. The gate driver 130, the data driver 150, the data distribution unit 170, and the controller 190 may be included in the peripheral area PA.

Each of the plurality of subpixels PX may be connected to a corresponding gate line among the plurality of gate lines GL1 through GLn and a corresponding data line among a plurality of data lines DL1 through DLm. Each of the plurality of gate lines GL1 through GLn may extend in a first direction (e.g., an x direction or a row direction) and may be connected to subpixels PX located in the same row. Each of the plurality of gate lines GL1 through GLn may transmit a gate signal to the subpixels PX in the same row. Each of the plurality of data lines DL1 through DLm may extend in a second direction (e.g., a y direction or a column direction) and may be connected to subpixels PX located in the same column.

The gate driver 130 may be connected to the plurality of gate lines GL1 through GLn, may generate gate signals according to a gate driving control signal GCS from the controller 190, and may sequentially supply the gate signals to the plurality of gate lines GL1 through GLn. When the gate signals are sequentially supplied to the plurality of gate lines GL1 through GLn, the subpixels PX may be selected in units of rows. Each of the plurality of data lines DL1 through DLm may transmit a data signal to subpixels PX in a selected row.

For example, the number of rows in the display apparatus 11 of FIG. 4 may be n, and the number of columns in the display apparatus 11 of FIG. 4 may be m. Here, n and m are natural numbers greater than 0, and, for convenience of explanation, it is assumed that they are even numbers. However, the numbers of rows and columns of a display apparatus according to the disclosure is not limited thereto.

Each of the plurality of gate lines GL1 through GLn may be electrically connected to a gate of a thin-film transistor included in a subpixel PX. The gate signal may be a gate control signal for controlling turn-on and turn-off operations of a thin-film transistor connected to a gate line. The gate signal may be a square wave signal in which an on-voltage for turning on a thin-film transistor and an off-voltage for turning off the thin-film transistor are repeated.

The data driver 150 may be connected to a plurality of output lines OL1 through $$OL\frac{m}{2},$$

and each of the plurality of output lines OL1 through $$OL\frac{m}{2}$$

may be connected to a corresponding data line among the plurality of data lines DL1 through DLm. The data driver 150 may convert an image signal into a data signal in the form of a voltage or current according to a data driving control signal DCS received from the controller 190. The data driver 150 may supply a data signal to the plurality of data lines DL1 through DLm via the plurality of output lines OL1 through $$OL\frac{m}{2}.$$

When m is not an even number, a data line or output line in the last column may not have a separate demultiplexer.

The data distribution unit 170 may be connected between the plurality of output lines OL1 through $$OL\frac{m}{2}$$

and the plurality of data lines DL1 through DLm. The data distribution unit 170 may include demultiplexers DMX1 through $$DMX\frac{m}{2}$$

including a plurality of switches. The data distribution unit 170 may include the demultiplexers DMX1 through

US 12,677,559 B2

$$DMX\frac{m}{2},$$

the number of which is the same as the number of output lines OL1 through $$OL\frac{m}{2}.$$

For example, the data distribution unit 170 may include the demultiplexers DMX1 through $$DMX\frac{m}{2},$$

the number of which is half of the number of data lines DL1 through DLm.

An end of each of the demultiplexers DMX1 through $$DMX\frac{m}{2}$$

may be connected to a corresponding output line among the plurality of output lines OL1 through $$OL\frac{m}{2}.$$

Another end of each of the demultiplexers DMX1 through $$DMX\frac{m}{2}$$

may be connected to a corresponding data line.

Each of the demultiplexers DMX1 through $$DMX\frac{m}{2}$$

according to an embodiment may include only one switch unit in contrast with a demultiplexer according to a comparative example. A difference between each of the demultiplexers DMX1 through $$DMX\frac{m}{2}$$

according to an embodiment and a demultiplexer according to a comparative example will be described in detail later.

Each of the demultiplexers DMX1 through $$DMX\frac{m}{2}$$

may supply a data signal supplied from the corresponding output line to the data line corresponding to the corresponding output line. By using a demultiplexer including one switch, only one data signal in which a first type of data signal and a second type of data signal are sequentially output may be provided to two columns of subpixel groups.

In order to achieve the same effect, switch units respectively corresponding to the plurality of data lines DL1 through DLm are needed in the conventional art, but, due to use of the demultiplexers DMX1 through $$DMX\frac{m}{2}$$

used in an embodiment of the disclosure, the number of switch units needed to drive the pixel unit 110 may be reduced to a half or less.

The controller 190 may generate the gate driving control signal GCS and the data driving control signal DCS, in accordance with synchronization signals received from an external source. The controller 190 may output the data driving control signal DCS to the data driver 150, and may supply the gate driving control signal GCS to the gate driver 130.

The controller 190 may output a distribution control signal CCS to the data distribution unit 170, and the data distribution unit 170 may control turn-on and turn-off operations of the switch unit included in each of the demultiplexers DMX1 through $$DMX\frac{m}{2},$$

in accordance with the distribution control signal CCS. A specific driving method will be described in detail later by using a timing diagram.

The gate driver 130, the data distribution unit 170, and the controller 190 may be formed directly on a substrate 200 of FIG. 5, which will be described later. The data driver 150 may be disposed on a flexible printed circuit board (FPCB) electrically connected to a pad disposed on one side of the substrate 200. According to an embodiment, the data driver 150 may be directly disposed on the substrate 200 by using a chip on glass (COG) or chip on plastic (COP) method.

When the display apparatus 11 is an organic light-emitting display apparatus, a first power supply voltage ELVDD and a second power supply voltage ELVSS may be supplied to the subpixels PX of the display apparatus 11. The first power supply voltage ELVDD may be a high-level voltage provided to a first electrode (i.e., a pixel electrode or an anode electrode) of a display element (light-emitting element) included in each of the subpixels PX. The second power supply voltage ELVSS may be a low-level voltage or ground voltage that is provided to a second electrode (i.e., an opposite electrode or a cathode electrode) of the display element included in each of the subpixels PX. The first power supply voltage ELVDD and the second power supply voltage ELVSS may be driving voltages for enabling the plurality of subpixels PX to emit light.

Although an organic light-emitting display apparatus will now be illustrated and described as the display apparatus 11 according to an embodiment, display apparatuses according to embodiments are not limited thereto. According to an embodiment, the display apparatus 11 according to an embodiment may be, for example, an inorganic light-emitting display apparatus or a quantum dot light-emitting display apparatus.

In the pixel unit 110, a plurality of subpixel groups PG1 through PGm may be arranged by grouping subpixels PX according to a criterion. Each of the plurality of subpixel groups PG1 through PGm may be understood as being classified based on its corresponding data line.

A first subpixel group PG1 may include a plurality of subpixels arranged along a first column. For example, the first subpixel group PG1 may include subpixels electrically connected to the first data line DL1.

A second subpixel group PG2 may include a plurality of subpixels arranged along a second column. For example, the second subpixel group PG2 may include subpixels electrically connected to the second data line DL2.

An i-th subpixel group PGi may include a plurality of subpixels arranged along an i-th column. For example, the i-th subpixel group PGi may include subpixels electrically connected to the i-th data line DLi. Here, i may be a natural number greater than 1 and less than m.

An m-th subpixel group PGm may include a plurality of subpixels arranged along an m-th column. For example, the m-th subpixel group PGm may include subpixels electrically connected to the m-th data line DLm. Here, m may be a natural number and may be greater than i.

For convenience of explanation, only some subpixel groups are shown in FIG. 4. However, those skilled in the art may easily understand other subpixel groups with only the illustration and descriptions of the some subpixel groups.

Referring to FIG. 4, the first output line OL1 may transmit a data signal to a first pair of subpixel groups (e.g., the first subpixel group PG1 and a fourth subpixel group PG4), and the first pair of subpixel groups may be subpixel groups that generate light of the same wavelength band. One subpixel group among the first pair of subpixel groups electrically connected to the first output line OL1 may receive a data signal through a first demultiplexer DMX1, and the other subpixel group may receive a data signal through the data line directly connected to the first output line OL1.

For example, the first demultiplexer DMX1 may be electrically connected to the first output line OL1. The first output line OL1 may be electrically connected to the first data line DL1 through the first demultiplexer DMX1, and the first data line DL1 may be electrically connected to the first subpixel group PG1. The first output line OL1 may be electrically connected to a fourth data line DL4, rather than via the first demultiplexer DMX1, and the fourth data line DL4 may be electrically connected to the fourth subpixel group PG4 that generates the same wavelength band as a wavelength band of the first subpixel group PG1.

A second output line OL2 may transmit a data signal to a second pair of subpixel groups (e.g., the second subpixel group PG2 and a fifth subpixel group PG5), and the second pair of subpixel groups may be subpixel groups that generate light of the same wavelength band. One subpixel group among the second pair of subpixel groups electrically connected to the second output line OL2 may receive a data signal through a second demultiplexer DMX2, and the other subpixel group may receive a data signal through a data line directly connected to the second output line OL2.

For example, the second demultiplexer DMX2 may be electrically connected to the second output line OL2. The second output line OL2 may be electrically connected to the second data line DL2 through the second demultiplexer DMX2, and the second data line DL2 may be electrically connected to the second subpixel group PG2. The second output line OL2 may be electrically connected to the fifth data line DL5, rather than via the second demultiplexer DMX2, and the fifth data line DL5 may be electrically connected to the fifth subpixel group PG5 that generates light of the same wavelength band as a wavelength band of light generated by the second subpixel group PG2.

A third output line OL3 may transmit a data signal to a third pair of subpixel groups (e.g., the third subpixel group PG3 and a sixth subpixel group PG6), and the third pair of subpixel groups may be subpixel groups that generate light of the same wavelength band. One subpixel group among the third pair of subpixel groups electrically connected to the third output line OL3 may receive a data signal through a third demultiplexer DMX3, and the other subpixel group may receive a data signal through a data line directly connected to the third output line OL3.

For example, the third demultiplexer DMX3 may be electrically connected to the third output line OL3. The third output line OL3 may be electrically connected to the third data line DL3 through the third demultiplexer DMX3, and the third data line DL3 may be electrically connected to the third subpixel group PG3. The third output line OL3 may be electrically connected to the sixth data line DL6, rather than via the third demultiplexer DMX3, and the sixth data line DL6 may be electrically connected to the sixth subpixel group PG6 that generates light of the same wavelength band as a wavelength band of light generated by the third subpixel group PG3.

The descriptions of the first output line OL1, the second output line OL2, the third output line OL3, the first demultiplexer DMX1, the second demultiplexer DMX2, and the third demultiplexer DMX3 given above are applicable to the other output lines and the other demultiplexers according to the same principle, and those skilled in the art may understand that the above descriptions alone provide sufficient descriptions of the other output lines and the other demultiplexers in this specification.

Figure 5:
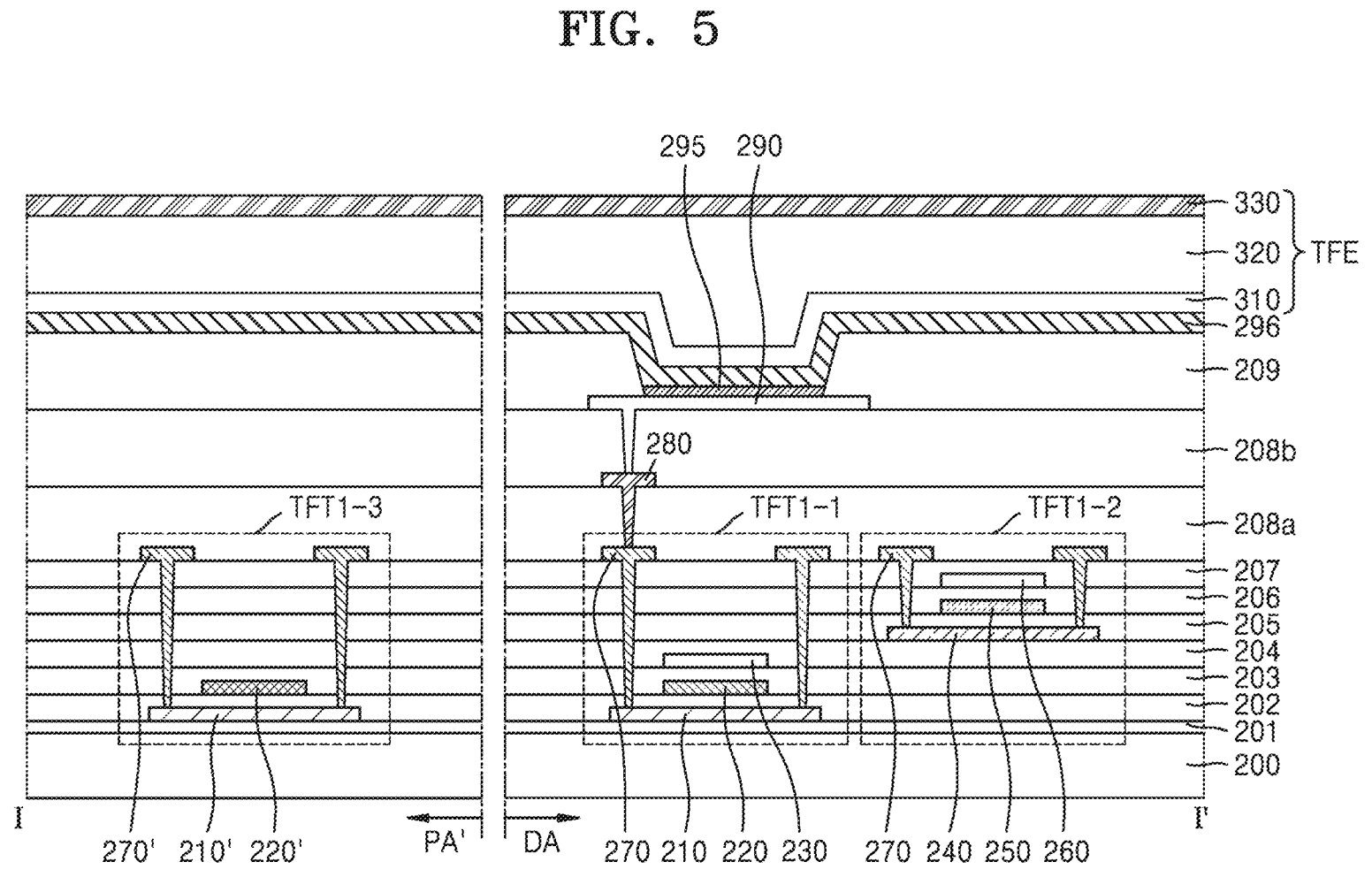

FIG. 5 is a schematic cross-sectional view taken along line I-I' of FIG. 1. For convenience of explanation, a portion of a cross-section taken along line I-I' of FIG. 1 may be omitted.

As described above, the substrate 200 may include an area corresponding to the display area DA and an area corresponding to the peripheral area PA around the display area DA. The substrate 200 may include various materials having flexible or bendable characteristics. For example, the substrate 200 may include glass, metal, or polymer resin. The substrate 200 may include polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 200 may have a multi-layered structure including two layers each including a polymer resin and a barrier layer including an inorganic material (silicon oxide, silicon nitride, silicon oxynitride, or the like) and located between the two layers. In this way, various modifications may be made.

A buffer layer 201 may be located on the substrate 200. The buffer layer 201 may serve as a barrier layer and/or a blocking layer for preventing diffusion of impurity ions and penetration of moisture or external air and planarizing an upper surface of the substrate 200. The buffer layer 201 may include silicon oxide, silicon nitride, or silicon oxynitride. The buffer layer 201 may control a heat supply rate during a crystallization process for forming first semiconductor layers 210 and 210', such that the first semiconductor layers 210 and 210' may be uniformly crystallized.

The first semiconductor layers 210 and 210' may be located on the buffer layer 201. The first semiconductor layers 210 and 210' may be formed of polysilicon, and may include a channel region undoped with impurities and a source region and a drain region both doped with impurities and respectively formed both sides of the channel region. The impurities may vary depending on the type of thin film transistor, and may be N-type impurities or P-type impurities.

A first gate insulating layer 202 may be located on the first semiconductor layers 210 and 210'. The first gate insulating layer 202 may be configured to secure insulation between the first semiconductor layers 210 and 210' and a first gate layer 220, which is to be described later. The first gate insulating layer 202 may include an inorganic material such as silicon oxide, silicon nitride, and/or silicon oxynitride, and may be interposed between the first semiconductor layers 210 and 210' and the first gate layer 220, which is to be described later. The first gate insulating layer 202 may have a shape corresponding to the entire surface of the substrate 200 and may have a structure in which contact holes are formed at preset portions. As such, an insulating layer including an inorganic material may be formed via chemical vapor deposition (CVD) or atomic layer deposition (ALD). This is equally applied to embodiments to be described later and modifications thereof.

The first gate layer 220 may be located on the first gate insulating layer 202. The first gate layer 220 may be disposed at a position vertically overlapping the first semiconductor layer 210, and may include at least one metal of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

A first' gate layer 220' may be located on the gate insulating layer 202, but may be disposed in the subarea PA' among the peripheral area PA. The first' gate layer 220' may be disposed on the same layer as the layer on which the first gate layer 220 is disposed, and may include the same material as the material included in the first gate layer 220. The first' gate layer 220' may be formed by using the same process as the process for forming the first gate layer 220, and may be formed simultaneously with the first gate layer 220.

A first interlayer insulating layer 203 may be located on the first gate layer 220. The first interlayer insulating layer 203 may cover the first gate layer 220. The first interlayer insulating layer 203 may be formed of an inorganic material. For example, the first interlayer insulating layer 203 may be metal oxide or metal nitride, and, particularly, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. In some embodiments, the first interlayer insulating layer 203 may have a dual structure of $SiO_x/SiN_y$ or $SiN_x/SiO_y$.

A second gate layer 230 may be located on the first interlayer insulating layer 203. In some cases, the second gate layer 230 may be omitted.

The second gate layer 230 may be disposed at a position vertically overlapping the first gate layer 220. Although omitted in FIG. 5 for convenience of explanation, in some cases, another gate layer (not illustrated) formed simultaneously with the second gate layer 230 may be disposed on the first' gate layer 220' disposed in the subarea PA'.

The second gate layer 230 may include at least one metal from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

In some cases, the second gate layer 230 may form the storage capacitor Cst of FIG. 3 together with the first gate layer 220. The first gate layer 220 may include one electrode of the storage capacitor Cst of FIG. 3, and the second gate layer 230 may include the other electrode of the storage capacitor Cst.

A second interlayer insulating layer 204 may be located on the second gate layer 230. The second interlayer insulating layer 204 may cover the second gate layer 230. The second interlayer insulating layer 204 may be formed of an inorganic material. For example, the second interlayer insulating layer 204 may be metal oxide or metal nitride, and, particularly, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. In some embodiments, the second interlayer insulating layer 204 may have a dual structure of $SiO_x/SiN_y$ or $SiN_x/SiO_y$.

A second semiconductor layer 240 may be located on the second interlayer insulating layer 204. The second semiconductor layer 240 may be formed of polysilicon or silicon oxide, and may mainly include silicon oxide. The second semiconductor layer 240 may include a channel region undoped with impurities and a source region and a drain region both doped with impurities and respectively formed both sides of the channel region. The impurities may vary depending on the type of thin film transistor, and may be N-type impurities or P-type impurities.

A second gate insulating layer 205 may be located on the second semiconductor layer 240. The second gate insulating layer 205 may be configured to secure insulation between the second semiconductor layer 240 and a third gate layer 250, which is to be described later. The second gate insulating layer 205 may include an inorganic material such as silicon oxide, silicon nitride, and/or silicon oxynitride, and may be interposed between the second semiconductor layer 240 and the third gate layer 250, which is to be described later. The second gate insulating layer 205 may have a shape corresponding to the entire surface of the substrate 200 and may have a structure in which contact holes are formed at preset portions. As such, an insulating layer including an inorganic material may be formed via chemical vapor deposition (CVD) or atomic layer deposition (ALD). This is equally applied to embodiments to be described later and modifications thereof.

The third gate layer 250 may be located on the second gate insulating layer 205. The third gate layer 250 may be disposed at a position vertically overlapping the second semiconductor layer 240, and may include at least one metal of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

A third interlayer insulating layer 206 may be located on the third gate layer 250. The third interlayer insulating layer 206 may cover the third gate layer 250. The third interlayer insulating layer 206 may be formed of an inorganic material. For example, the third interlayer insulating layer 206 may be metal oxide or metal nitride, and, particularly, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. In some embodiments, the third interlayer insulating layer 206 may have a dual structure of $SiO_x/SiN_y$ or $SiN_x/SiO_y$.

A fourth gate layer 260 may be located on the third interlayer insulating layer 206. In some cases, the fourth gate layer 260 may be omitted.

The fourth gate layer 260 may be disposed at a position vertically overlapping the second gate layer 250, and may include at least one metal of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

In some cases, the fourth gate layer 260 and the third gate layer 250 may form a capacitor. The fourth gate layer 260 may be one electrode of the separate capacitor, and the third gate layer 250 may be the other electrode of the separate capacitor.

A fourth interlayer insulating layer 207 may be located on the fourth gate layer 260. The fourth interlayer insulating layer 207 may cover the fourth gate layer 260. The fourth interlayer insulating layer 207 may be formed of an inorganic material. For example, the fourth interlayer insulating layer 207 may be metal oxide or metal nitride, and, particularly, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. In some embodiments, the fourth interlayer insulating layer 207 may have a dual structure of $SiO_x/SiN_y$ or $SiN_x/SiO_y$.

A first conductive layer 270 may be located on the fourth interlayer insulating layer 207. The first conductive layer 270 may serve as an electrode that is connected to source/drain regions of the first semiconductor layers 210 and 210' through a through hole passing through the first gate insulating layer 202 and the first, second, third, and fourth interlayer insulating layers 203, 204, 206, and 207.

The first conductive layer 270 may serve as an electrode that is connected to source/drain regions of the second semiconductor layer 240 through a through hole passing through the second gate insulating layer 205, the third interlayer insulating layer 206, and the fourth interlayer insulating layer 207.

The first conductive layer 270 may include at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). For example, the first conductive layer 270 may include a Ti layer, an Al layer, and/or a Cu layer.

A first' conductive layer 270' disposed on the same layer as the layer on which the first conductive layer 270 is disposed, but disposed in the sub-area PA', may be located above the fourth interlayer insulating layer 207. The first' conductive layer 270' may be disposed on the same layer as the layer on which the first conductive layer 270 is disposed, and may include the same material as the material included in the first conductive layer 270. The first' conductive layer 270' may be formed by using the same process as the process for forming the first conductive layer 270, and may be formed simultaneously with the first conductive layer 270. As a result, a structure of the first' conductive layer 270' may be identical to that of the first conductive layer 270.

The first conductive layer 270 and/or the first' conductive layer 270' may constitute at least a portion of data lines or wiring described later. For convenience of explanation, FIGS. 8 through 10 to be described later illustrate planar data lines/wiring, and the data lines/wiring may be a component including the first conductive layer 270 and/or the first' conductive layer 270'.

A first organic insulating layer 208a may be located on the first conductive layer 270. The first organic insulating layer 208a may be an organic insulating layer that covers an upper portion of the first conductive layer 270 and has a substantially flat upper surface to serve as a planarization layer. The first organic insulating layer 208a may include an organic material, such as, acryl, benzocyclobutene (BCB) or hexamethyldisiloxane (HMDSO). Various modifications may be made to the first organic insulating layer 208a. For example, the first organic insulating layer 208a may be a single layer or multiple layers.

A second conductive layer 280 may be located on the first organic insulating layer 208a. The second conductive layer 280 may serve as an electrode that is connected to source/drain regions of a semiconductor layer through a through hole included in the first organic insulating layer 208a. The second conductive layer 280 may include at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). For example, the second conductive layer 280 may include a Ti layer, an Al layer, and/or a Cu layer.

The first conductive layer 270, the first' conductive layer 270', and the second conductive layer 280 may constitute at least a portion of the data lines or wiring, which will be described later. For convenience of explanation, FIGS. 8 through 10 to be described later illustrate planar data lines/wiring, and the data lines/wiring may be a component including the first conductive layer 270, the first' conductive layer 270', and the second conductive layer 280.

A second organic insulating layer 208b may be located on the second conductive layer 280. The second organic insulating layer 208b may be an organic insulating layer that covers an upper portion of the second conductive layer 280 and has a substantially flat upper surface to serve as a planarization layer. The second organic insulating layer 208b may include an organic material, such as, acryl, benzocyclobutene (BCB) or hexamethyldisiloxane (HMDSO). Various modifications may be made to the second organic insulating layer 208b. For example, the second organic insulating layer 208b may be a single layer or multiple layers.

Although not shown in FIG. 5, an additional conductive layer and an additional insulating layer may be interposed between a conductive layer and a pixel electrode, and may be applied to various embodiments. In this case, the additional conductive layer may include the same material as that included in the above-described conductive layer, and have the same layer structure as the above-described conductive layer. The additional insulating layer may include the same material as that included in the above-described organic insulating layer, and have the same layer structure as the above-described organic insulating layer.

A pixel electrode 290 may be located on the second organic insulating layer 208b. The pixel electrode 290 may be connected to the conductive layer 280 through a contact hole formed in the second organic insulating layer 208b. A display element may be located on the pixel electrode 290. An organic light-emitting diode OLED may be used as the display element. In other words, the organic light-emitting diode OLED may be located on, for example, the pixel electrode 290. The pixel electrode 290 may include a light-transmissive conductive layer formed of a light-transmissive conductive oxide such as ITO, $In_2O_3$, or IZO, and a reflective layer formed of a metal such as Al or Ag. For example, the pixel electrode 290 may have a three-layered structure of ITO/Ag/ITO.

A pixel defining layer 209 may be located on the second organic insulating layer 208b, and may be disposed to cover an edge of the pixel electrode 290. In other words, the pixel defining layer 209 may cover an edge of the pixel electrode 290. The pixel defining layer 209 may have an opening corresponding to a subpixel PX, and the opening may be formed to extend to and expose at least a central portion of the pixel electrode 290. The pixel defining layer 209 may include an organic material, for example, polyimide or HMDSO.

An intermediate layer 295 and an opposite electrode 296 may be located on the opening of the pixel defining layer 209. The intermediate layer 295 may include a low molecular weight or high molecular weight material, and, when the intermediate layer 295 includes a low-molecular weight material, the intermediate layer 295 may include a hole injection layer, a hole transport layer (HTL), an emission layer, an electron transport layer, and/or an electron injection layer. When the intermediate layer 295 includes a high-molecular weight material, the intermediate layer 295 may generally have a structure including an HTL and an emission layer.

The opposite electrode 296 may include a light-transmissive conductive layer formed of a light-transmissive conductive oxide such as ITO, $In_2O_3$, or IZO. The pixel electrode 290 is used as an anode electrode, and the opposite electrode 296 is used as a cathode electrode. In an embodiment, the pixel electrode 290 may be used as a cathode electrode, and the opposite electrode 296 may be used as an anode electrode.

The intermediate layer 295 is not limited to the above-described structure, and may have any of various other structures. For example, at least one of the layers that constitute the intermediate layer 295 may be integrally formed with the opposite electrode 296. According to an embodiment, the intermediate layer 295 may include a layer patterned to correspond to each of a plurality of pixel electrodes 290.

The opposite electrode 296 may be arranged in the display area DA and may cover the entire display area DA. In other words, the opposite electrode 296 may be integrally formed to cover a plurality of pixels. The opposite electrode 296 may electrically contact a common power supply line (not shown) arranged in the peripheral area PA.

A thin-film encapsulation layer TFE may include a first inorganic encapsulation layer 310, a second inorganic encapsulation layer 330, and an organic encapsulation layer 320 therebetween. The first inorganic encapsulation layer 310 and the second inorganic encapsulation layer 330 may include at least one inorganic material, such as aluminum oxide, titanium oxide, tantalum oxide, hafnium oxide, zinc oxide, silicon oxide, silicon nitride, and silicon oxynitride.

The first inorganic encapsulation layer 310 and the second inorganic encapsulation layer 330 may be a single layer or multi-layer including the aforementioned materials. The first inorganic encapsulation layer 310 and the second inorganic encapsulation layer 330 may include the same material or may include different materials. Thicknesses of the first inorganic encapsulation layer 310 and the second inorganic encapsulation layer 330 may be different from each other.

The thickness of the first inorganic encapsulation layer 310 may be greater than the thickness of the second inorganic encapsulation layer 330. In an embodiment, the thickness of the second inorganic encapsulation layer 330 may be greater than the thickness of the first inorganic encapsulation layer 310, or the thicknesses of the first inorganic encapsulation layer 310 and the second inorganic encapsulation layer 330 may be the same.

The organic encapsulation layer 320 may include a monomer-based material or a polymer-based material. Examples of the polymer-based material may include an acrylic resin, an epoxy-based resin, polyimide, and polyethylene. According to an embodiment, the organic encapsulation layer 320 may include acrylate.

A barrier wall (not shown) may be located in the peripheral area PA of the substrate 200. The barrier wall may be arranged to surround the display area DA, and may prevent the organic encapsulation layer 320 of the thin-film encapsulation layer TFE from over-flowing to the outside of the substrate 200. Accordingly, the organic encapsulation layer 320 may contact an inner surface of the barrier wall that faces the display area DA. In this case, the organic encapsulation layer 320 contacting the inner surface of the barrier wall may be understood as the first inorganic encapsulation layer 310 being located between the organic encapsulation layer 320 and the barrier wall and the organic encapsulation layer 320 being in direct contact with the first inorganic encapsulation layer 310. The first inorganic encapsulation layer 310 and the second inorganic encapsulation layer 330 may be on the barrier wall and may extend toward an edge of the substrate 200. However, in some cases, a plurality of barrier walls (not shown) may be included.

According to an embodiment, the thin-film encapsulation layer TFE may be replaced by another component that performs a sealing function. In this case, the barrier wall (not shown) may be omitted.

Referring to FIG. 5, a $1\text{-}1^{st}$ thin-film transistor TFT1-1 and a $1\text{-}2^{nd}$ thin-film transistor TFT1-2 for implementing a pixel circuit may be arranged in the display area DA. In order to distribute data in the subarea PA', a $1\text{-}3^{rd}$ thin-film transistor TFT1-3 corresponding to a switch unit included in a demultiplexer, which is to be described later, may be disposed in the subarea PA'. The $1\text{-}3^{rd}$ thin-film transistor TFT1-3 may be formed simultaneously with the $1\text{-}1^{st}$ thin-film transistor TFT1-1 in the same process as the process for forming the $1\text{-}1^{st}$ thin-film transistor TFT1-1. The $1\text{-}3^{rd}$ thin-film transistor TFT1-3 may be disposed on the same layer as the layer on which the $1\text{-}1^{st}$ thin-film transistor TFT1-1 is formed.

In some cases, a component corresponding to the second gate layer 230 of the $1\text{-}1^{st}$ thin-film transistor TFT1-1 may be omitted in the $1\text{-}3^{rd}$ thin-film transistor TFT1-3, because a separate capacitor structure may not be needed to implement a demultiplexer.

Although not shown in FIG. 5, the first' conductive layer 270' and the first conductive layer 270 may be electrically connected to each other. For example, a bridge wiring (not shown) may be additionally added to the same layer as the second conductive layer 280 so that the first' conductive layer 270' and the first conductive layer 270 may be electrically connected to each other. Additionally, various forms of bridge wiring (not shown) may be used to electrically connect layers having conductivity properties to each other.

For example, in order for the first' conductive layer 270' and the first conductive layer 270 to be electrically connected to each other, an additional wiring connecting the first' conductive layer 270' and the first conductive layer 270 may be arranged on the same layer as the layer on which the first' conductive layer 270' or the first conductive layer 270 is arranged, or may be arranged on a different layer from the layer on which the first' conductive layer 270' or the first conductive layer 270 is arranged.

Figure 6:
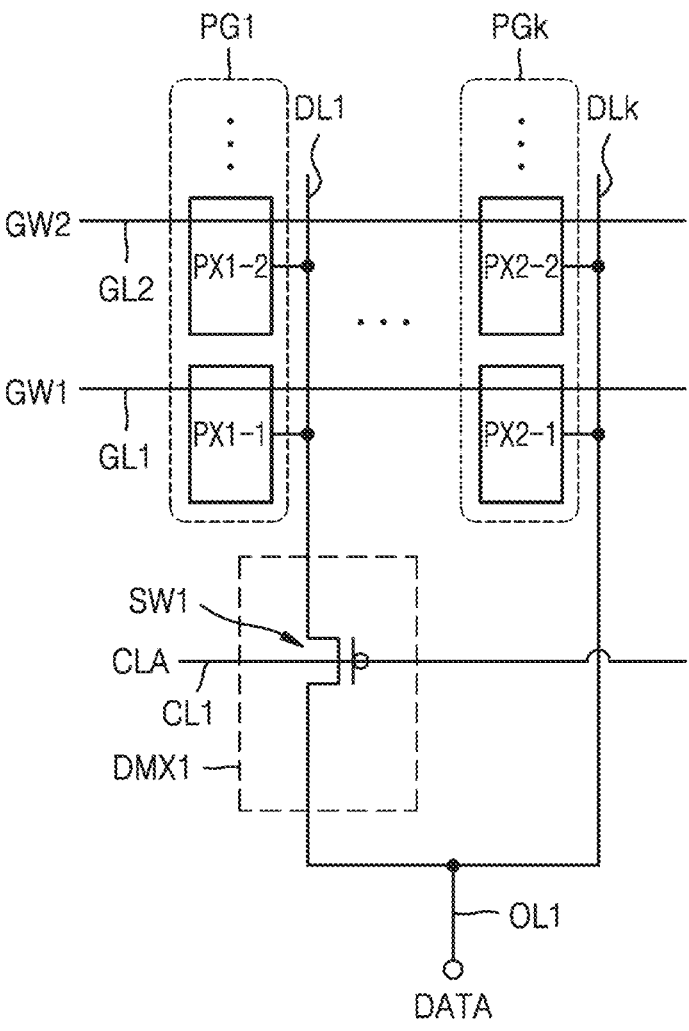
FIG. 6 is a circuit drawing for explaining an example in which a demultiplexer included in a data distribution unit of FIG. 4 is applied.
Figure 7:
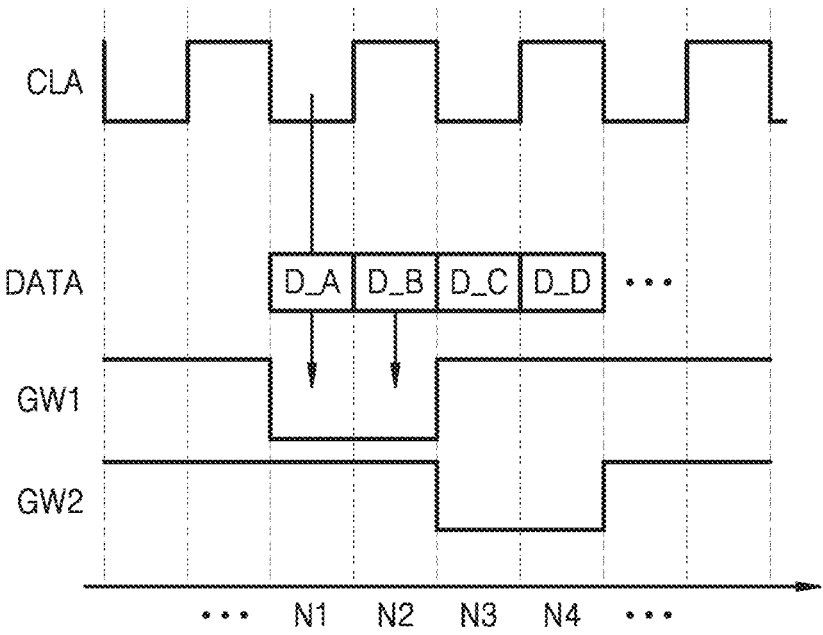
FIG. 7 is a timing diagram illustrating signals for the subpixel of FIG. 2 or the subpixel of FIG. 3.

FIG. 6 is a circuit drawing for explaining an example in which a demultiplexer included in the data distribution unit 170 of FIG. 4 is applied, and FIG. 7 is a timing diagram illustrating signals for the subpixel PX of FIG. 2 or the subpixel PX of FIG. 3.

FIG. 6 schematically illustrates an example of a circuit diagram including a first switch SW1 disposed between the first output line OL1 and the first data line DL1 and electrically connecting the first output line OL1 to the first data line DL1. The description of FIG. 6 may be equally applied to data lines other than the first data line DL1 and other demultiplexers other than the first demultiplexer DMX1.

The first switch SW1 may be disposed between the first output line OL1 and the first data line DL1, and may electrically connect the first output line OL1 to the first data line DL1. The first switch SW1 may be turned on or off by a first control signal CLA applied to a first control signal line CL1, and may transmit a data signal DATA applied to the first output line OL1 to the first data line DL1.

A k-th data line DLk may be directly connected to the first output line OL1. For example, a separate switch may be omitted between the k-th data line DLk and the first output line OL1. Accordingly, the data signal DATA applied to the first output line OL1 may be completely transmitted to the k-th data line DLk.

For example, the k-th data line DLk may be the fourth data line DL4 as shown in FIG. 4, or may be a data line other than the fourth data line DL4. A k-th subpixel group PGk to which the k-th data line DLk is connected may include subpixels that emit light of the same wavelength band as that of light emitted by the subpixels of the first subpixel group PG1 to which the first data line DL1 is connected.

For convenience of explanation, the natural number k is used in the description, but those skilled in the art may clearly understand that subpixel groups may be arranged in various combinations.

The description of the first data line DL1 given above is also equally applied to odd-numbered data lines excluding the first data line DL1. The description of the first output line OL1 given above is also equally applied to other output lines excluding the first output line OL1. The description of the first data line DL1 given above is also equally applied to even-numbered data lines excluding the second data line DL2. However, a distinction between odd numbers and even numbers is simply for convenience of explanation. In some cases, the characteristics of odd-numbered data lines and the characteristics of even-numbered data lines may be interchanged.

Referring to FIG. 6, a first gate signal GW1 may be transmitted to a 1-1$^{st}$ subpixel PX1-1 included in the first subpixel group PG1 and a 2-1$^{st}$ subpixel PX2-1 included in the k-th subpixel group PGk through the first gate line GL1.

A second gate signal GW2 may be transmitted to a 1-2$^{nd}$ subpixel PX1-2 included in the first subpixel group PG1 and a 2-2$^{nd}$ subpixel PX2-2 included in the k-th subpixel group PGk through the second gate line GL2. In addition, an n-th gate signal may be transmitted to other subpixels through an n-th gate line.

As illustrated in FIG. 6, the 1-1$^{st}$ subpixel PX1-1 and the 1-2$^{nd}$ subpixel PX1-2 may be some of the subpixels included in the first subpixel group PG1. The 1-1$^{st}$ subpixel PX1-1 and the 1-2$^{nd}$ subpixel PX1-2 may be electrically connected to the first data line DL1, and may receive the data signal DATA from the first data line DL1.

The first data line DL1 may be electrically connected to the first demultiplexer DMX1. For example, the first data line DL1 may be electrically connected directly to the first switch SW1. The first data line DL1 and the k-th data line DLk may be electrically connected to the first output line OL1. The first data line DL1 and the k-th data line DLk may simultaneously receive the data signal DATA from the first output line OL1.

When the first switch SW1 is turned on by the first control signal CLA, the 1-1$^{st}$ subpixel PX1-1 and the 1-2$^{nd}$ subpixel PX1-2 may receive the data signal DATA from the first data line DL1. When the first switch SW1 is turned off by the first control signal CLA, the 1-1$^{st}$ subpixel PX1-1 and the 1-2$^{nd}$ subpixel PX1-2 may not receive the data signal DATA from the first data line DL1.

The 2-1$^{st}$ subpixel PX2-1 and the 2-2$^{nd}$ subpixel PX2-2 may be some of the subpixels included in the k-th subpixel group PGk. The 2-1$^{st}$ subpixel PX2-1 and the 2-2$^{nd}$ subpixel PX2-2 may be electrically connected to the k-th_data line DLK, and may receive the data signal DATA from the k-th data line DLk. In this case, a demultiplexer directly connected to the k-th data line DLk may be omitted or may not be provided.

The data signal DATA may be completely applied from the first output line OL1 to the 2-1$^{st}$ subpixel PX2-1, the 2-2$^{nd}$ subpixel PX2-2, and the k-th data line DLk regardless of the first control signal CLA.

Each of the subpixels illustrated in FIG. 6 may include the pixel circuit PC of FIG. 2 or the pixel circuit PC of FIG. 3. For example, the 2-1$^{st}$ subpixel PX2-1 and the 2-2$^{nd}$ subpixel PX2-2 may be the subpixels PX of FIG. 2 or the subpixels PX of FIG. 3. The subpixel PX of FIG. 2 or the subpixel PX of FIG. 3 may be a so-called compensation separation pixel. The compensation separation pixel may include the storage capacitor Cst electrically connected to the driving transistor Td, and a data signal DATA transmitted to the compensation separation pixel may be recorded in the storage capacitor Cst.

Figure 16:
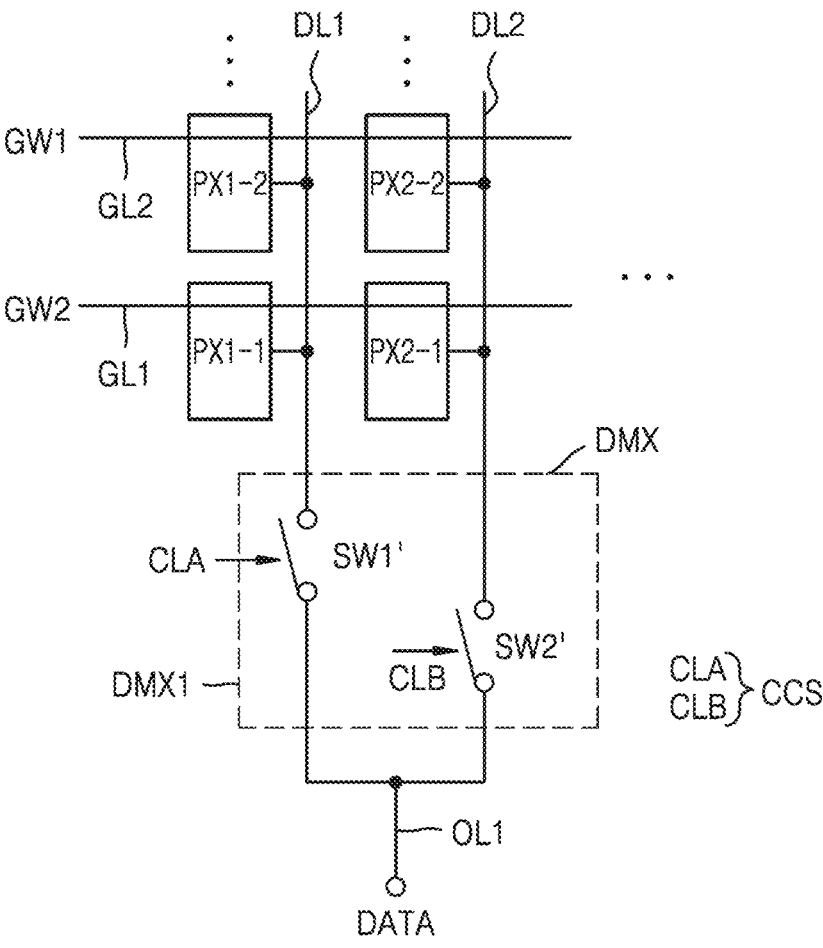
FIG. 16 is a drawing illustrating an example of a demultiplexer of a display apparatus according to a comparative example.
Figure 17:
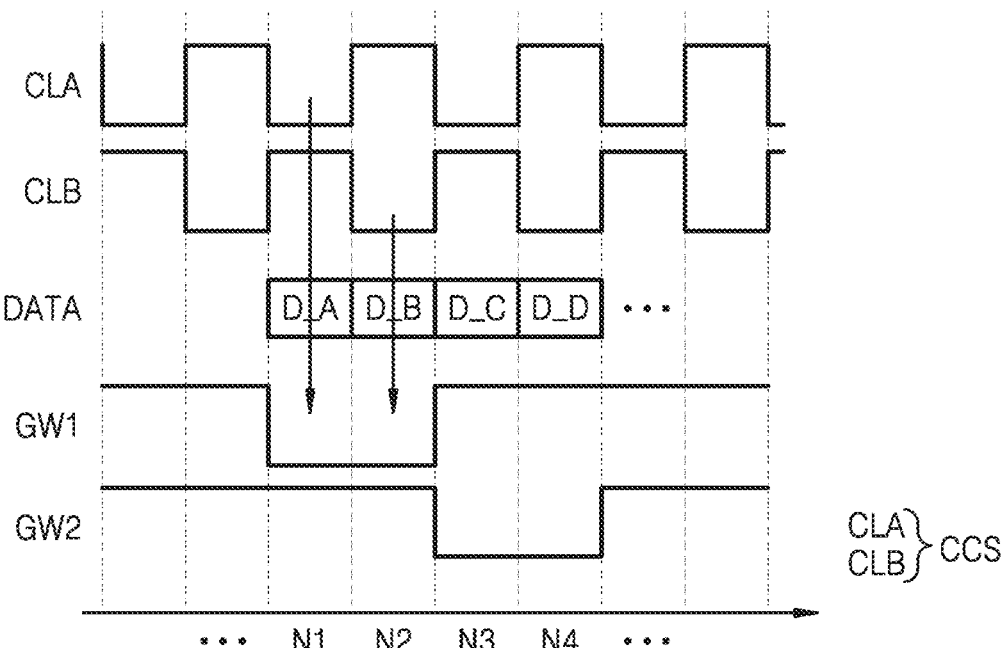
FIG. 17 is a timing diagram showing signals provided to a pixel by using the demultiplexer of FIG. 16.

As illustrated in FIG. 7, a second control signal CLB of FIGS. 16 and 17 may be omitted. For example, in a first section N1, the data signal DATA may be a data signal A D_A, and, in a second section N2, the data signal DATA may be a data signal B D_B. For example, in a third section N3, the data signal DATA may be a data signal C D_C, and, in a fourth section N4, the data signal DATA may be a data signal D D_D.

For example, the first gate line GL1 may be electrically connected to subpixels representing one row on the screen among subpixels included in a plurality of subpixel groups. For example, a thin-film transistor (e.g., the switching thin-film transistor Ts) connected to the first gate line GL1 may be turned on when a voltage smaller than a threshold value is received. The voltage received via the first gate layer GL1 may be the first gate signal GW1.

Referring to FIGS. 6 and 7, the subpixels electrically connected to the first gate line GL1 may be the 1-1$^{st}$ subpixel PX1-1 and the 2-1$^{st}$ subpixel PX2-1. A turn-on signal among the first gate signals GW1 may be transmitted to the 1-1$^{st}$ subpixel PX1-1 and the 2-1$^{st}$ subpixel PX2-1 through the first gate line GL1 during the first section N1 and the second section N2. For example, the second section N2, which is a time point or time period after the first section N1, may refer to a time point or time period that immediately follows and is contiguous with the end of the first section N1.

For example, in the first section N1, the first control signal CLA may turn on the first switch SW1. The data signal A D_A in FIG. 7 may be applied to the 1-1$^{st}$ subpixel PX1-1 and the 1-2$^{nd}$ subpixel PX1-2 through the turned-on first switch SW1. When the data signal A D_A is applied, a turn-on voltage among the first gate signal GW1 may be transmitted to a gate terminal of the switching transistor Ts of the 1-1$^{st}$ subpixel PX1-1. In this way, due to a matrix structure of the first data line DL1 and the first gate line GL1, the 1-1$^{st}$ subpixel PX1-1 may be turned on by as much as a brightness according to the data signal A D_A.

For example, in the second section N2, the first control signal CLA may turn off the first switch SW1. The data signal A D_A may not be applied to the 1-1$^{st}$ subpixel PX1-1 and the 1-2$^{nd}$ subpixel PX1-2 through the turned-off first switch SW1. Accordingly, even when the turn-on voltage of the first gate signal GW1 is applied to the switching transistor Td of the 1-1$^{st}$ subpixel PX1-1, the data signal A D_A is not applied to the 1-1$^{st}$ subpixel PX1-1.

For example, as a switch directly connected to the k-th data line DLk is omitted, the data signal DATA may be completely applied to the 2-1$^{st}$ subpixel PX2-1 and the 2-2$^{nd}$ subpixel PX2-2 through the k-th data line DLk in the first section N1 and the second section N2. When the turn-on voltage of the first gate signal GW1 is applied to the switching transistor Td of the 2-1$^{st}$ subpixel PX2-1, the data signal A D_A may be written to the storage capacitor Cst of the 2-1$^{st}$ subpixel PX2-1, and then the data signal B D_B may be written thereto. Because the data signal A D_A and the data signal B D_B are consecutively recorded in the storage capacitor Cst (see FIG. 3 or 4) of the 2-1$^{st}$ subpixel PX2-1, a data signal ultimately recorded in the storage capacitor Cst may be the data signal B D_B. Therefore, a separate switch directly connected to the k-th data line DLk is not needed, and, unlike a conventional demultiplexer, a switch directly connected to the k-th data line DLk may be omitted or may not be provided.

As shown in FIG. 7, a data signal passing through one data line may include the data signal A D_A and the data signal B D_B. Accordingly, it may be understood that a k-th data signal passing through a k-th data line, which will be described later, also includes the data signal A D_A and the data signal B D_B.

Referring to FIGS. 6 and 7, the subpixels electrically connected to the second gate line GL2 may be the 1-2$^{nd}$ subpixel PX1-2 and the 2-2$^{nd}$ subpixel PX2-2. A turn-on signal among the second gate signals GW2 may be transmitted to the 1-2$^{nd}$ subpixel PX1-2 and the 2-2$^{nd}$ subpixel PX2-2 through the second gate line GL2 during the third section N3 and the fourth section N4. For example, the third section N3, which is a time point or time period after the second section N2, may refer to a time point or time period that immediately follows and is contiguous with the end of the second section N2. For example, the fourth section N4, which is a time point or time period after the third section N3, may refer to a time point or time period that immediately follows and is contiguous with the end of the third section N3.

For example, in the third section N3, the first control signal CLA may turn on the first switch SW1. The data signal C D_C may be applied to the 1-1$^{st}$ subpixel PX1-1 and the 1-2$^{nd}$ subpixel PX1-2 through the turned-on first switch SW1. When the data signal C D_C is applied, a turn-on voltage among the second gate signal GW2 may be transmitted to a gate terminal of the switching transistor Ts of the 1-2$^{nd}$ subpixel PX1-2. In this way, due to a matrix structure of the first data line DL1 and the second gate line GL2, the 1-2nd subpixel PX1-2 may be turned on by as much as a brightness according to the data signal C D_C.

For example, in the fourth section N4, the first control signal CLA may turn off the first switch SW1. The data signal D D_D may not be applied to the 1-1$^{st}$ subpixel PX1-1 and the 1-2$^{nd}$ subpixel PX1-2 through the turned-off first switch SW1. Accordingly, even when the turn-on voltage of the second gate signal GW2 is applied to the switching transistor Td of the 1-2$^{nd}$ subpixel PX1-2, the data signal D D_D is not applied to the 1-2$^{nd}$ subpixel PX1-2.

For example, as a second switch unit is omitted in FIG. 6, the data signal DATA may be completely applied to the 2-1$^{st}$ subpixel PX2-1 and the 2-2$^{nd}$ subpixel PX2-2 through the k-th data line DLk in the third section N3 and the fourth section N4. When the turn-on voltage of the second gate signal GW2 is applied to the switching transistor Td of the 2-2$^{nd}$ subpixel PX2-2, the data signal C D_C may be written to the storage capacitor Cst of the 2-2$^{nd}$ subpixel PX2-2, and then the data signal D D_D may be written thereto. Because the data signal C D_C and the data signal D D_D are consecutively recorded in the storage capacitor Cst of the 2-2$^{nd}$ subpixel PX2-2, a data signal ultimately recorded in the storage capacitor Cst may be the data signal D D_D. Therefore, a separate switch (not shown) connected to the k-th data line DLk is not needed, and, unlike a conventional demultiplexer, a separate switch electrically connected to the k-th data line DLk may be omitted.

Because the second control signal CLB (see FIGS. 16-17 for example) is not used, power used to distribute the data signal DATA may be reduced. Additionally, as a separate switch controlled by the second control signal CLB is also omitted, power used in a demultiplexer may be reduced.

Figure 8:
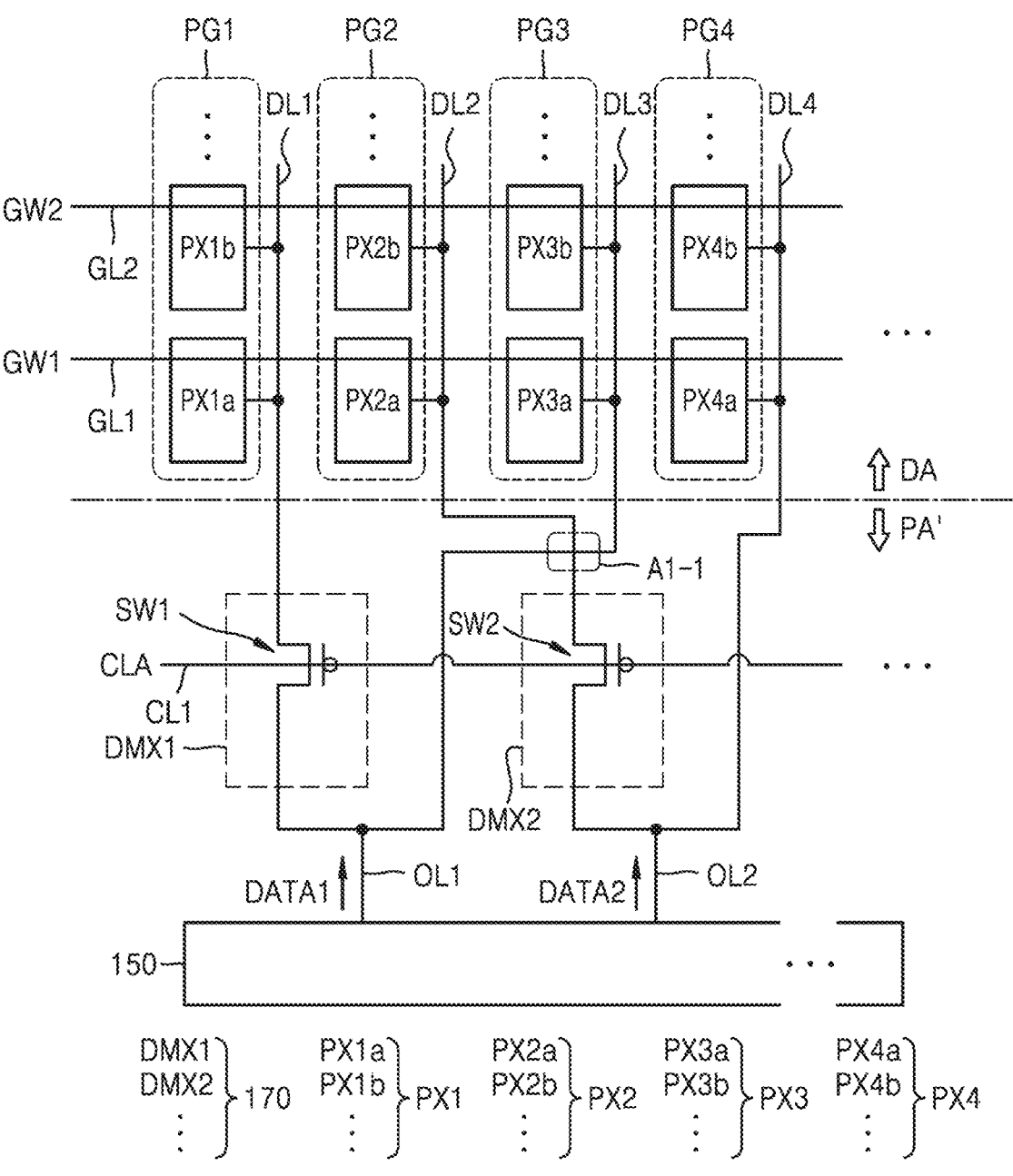
FIG. 8 is a conceptual diagram schematically illustrating an example of respective portions of a subarea and a display area of FIG. 1.

FIG. 8 is a conceptual diagram schematically illustrating an example of respective portions of the subarea PA' and the display area DA of FIG. 1.

FIG. 8 illustrates the first through fourth subpixel groups PG1 through PG4, the data lines DL1 through DL4, and the gate lines GL1 and GL2, and the other subpixel groups, the other data lines, and the other gate lines are omitted for convenience of explanation. Those skilled in the art may clearly understand the omitted components based solely on the descriptions given herein.

As illustrated in FIG. 8, a plurality of subpixels may be arranged in the display area DA. A plurality of subpixel groups including the first through fourth subpixel groups PG1 through PG4 may be arranged in the display area DA.

For example, a structure in which the plurality of subpixels are arranged in FIG. 8 may be a PenTile™ structure. Accordingly, the first subpixel group PG1 and the third subpixel group PG3 may receive data signals from the same output line, and the second subpixel group PG2 and the fourth subpixel group PG4 may receive data signals from the same output line. For example, in the case of a PenTile™ structure, the k-th subpixel group and the (k+2)th subpixel group may receive data signals from the same output line (where k is a natural number greater than or equal to 1).

For example, the first data line DL1 may be electrically connected to the subpixels included in first subpixel groups PG1. The first data line DL1 may extend approximately in a column direction on a plan view, and the first subpixel group PG1 may include subpixels arranged approximately in the column direction on the plan view. The first data line DL1 may be electrically connected to the first switch SW1, and the first switch SW1 may be turned on or off by the first control signal CLA.

For example, the k-th data line may be electrically connected to the subpixels included in k-th subpixel groups. The k-th data line may extend approximately in a column direction on a plan view, and the k-th subpixel group may include subpixels arranged approximately in the column direction on the plan view. Some (e.g., (2k−1)th data lines) of the k-th data lines may be electrically connected to a k-th switch, and the k-th switch may be turned on or off by the first control signal CLA. The second through fourth data lines DL2 through DL4 of FIG. 8 may be understood as examples of the k-th data line. For example, the first gate line GL1 may be electrically connected to subpixels arranged in a row direction among the plurality of subpixels. The first gate line GL1 may be electrically connected to subpixels arranged in a first row among the plurality of subpixels. The first gate line GL1 may extend approximately in the row direction on the plan view, and the first gate line GL1 may be electrically connected to the gate terminals of the switching transistors Ts (see FIGS. 2 and 3) of the subpixels arranged in the row direction.

For example, the k-th gate line may be electrically connected to subpixels arranged in a row direction among a plurality of subpixels. The k-th gate line may be electrically connected to subpixels arranged in a k-th row among the plurality of subpixels. The k-th gate line may extend approximately in the row direction on the plan view, and may be electrically connected to the gate terminals of the switching transistors Ts (see FIGS. 2 and 3) of the subpixels arranged in the row direction. The second gate line GL2 of FIG. 8 may be understood as an example of the k-th gate line, and the second gate signal GW2 may be understood as an example of the k-th gate signal.

As illustrated in FIG. 8, the data distribution unit 170 may include a plurality of switches. Each of the plurality of switches may be a thin-film transistor. Unlike a conventional demultiplexer, some of the switches or thin-film transistors are omitted, so the size of an area where the plurality of switches are arranged in the subarea PA' may be significantly reduced.

For example, the peripheral area PA or the subarea PA' on a substrate may include one area where a plurality of switches are arranged and another area where a plurality of switches are not arranged. The one area may be located on one side of the peripheral area PA or the subarea PA', and the other area may be located on the other side of the peripheral area PA or the subarea PA'.

As illustrated in FIG. 8, a plurality of switches SW1 and SW2 may be arranged in one portion of a subarea PA'. As a result, the data lines DL1 through DL4 may have various arrangement forms in order to transmit data signals to subpixel groups corresponding to the data signals, and the arrangement form illustrated in FIG. 8 is merely an example.

When the layout of the data lines DL1 through DL4 is designed, an area A1-1 of FIG. 8 where the data lines DL1 through DL4 intersect each other may occur. As the switches SW1 and SW2 are arranged in one area, some of the data lines DL1 through DL4 may cross each other. For reference, the location of the area A1-1 of FIG. 8 where the data lines DL1 through DL4 intersect each other, illustrated in FIG. 8, is only an example, and other areas may exist, and examples of locations of areas where the data lines DL1 through DL4 intersect each other may include various modifications.

Some of the data lines DL1 through DL4 may intersect each other on the plan view. In other words, some of the data lines DL1 through DL4 may overlap each other when viewed in a direction perpendicular to the substrate 200, and some of the data lines DL1 through DL4 may be spaced apart from each other vertically on a cross-sectional view. As a result, some of the data lines DL1 through DL4 may not be electrically connected to each other. When the data lines DL1 through DL4 are arranged within a certain distance even when being spaced apart from each other vertically on a cross-sectional view, the data lines DL1 through DL4 crossing each other vertically may cause signal interference between each other. To prevent this signal interference, a separate shielding layer may be disposed between the data lines DL1 through DL4 crossing each other vertically. This will be described in detail later.

Referring to FIGS. 6 through 8, the display apparatus 11 according to an embodiment may include the substrate 200, and the plurality of subpixel groups PG1 through PG4 are disposed on the substrate 200 and include the first subpixel group PG1 and including first subpixels PX1 and a second subpixel group PG2 including second subpixels PX2.

For example, the first subpixels PX1 may refer to subpixels electrically connected to the first data line DL1 or arranged along a first column. For example, the first subpixels PX1 may refer to subpixels included in the first subpixel group PG1. For example, the first subpixels PX1 may be subpixels for emitting light of one of three primary colors of light, or may be subpixels for emitting red-based light or blue-based light.

As described above, the example shown in FIG. 8 may be a PenTile™ structure. In this case, the 1a-th subpixel PX1*a* among the first subpixels PX1 may generate light of a first wavelength band (e.g., one of red-based visible light and blue-based visible light). The 1b-th subpixel PX1*b* among the first subpixels PX1 may generate light of a third wavelength band (e.g., the other of red-based visible light and blue-based visible light). For example, subpixels of the first subpixel group PG1 connected to odd-numbered gate lines may generate the light of the first wavelength band, and subpixels of the first subpixel group PG1 connected to even-numbered gate lines may generate the light of the third wavelength band.

For example, the second subpixels PX2 may refer to subpixels electrically connected to the second data line DL2 or arranged along a second column. For example, the second subpixels PX2 may refer to subpixels included in the second subpixel group PG2. For example, the second subpixels PX2 may be subpixels for emitting light of one of three primary colors of light (e.g., green-based light).

As described above, the example shown in FIG. 8 may be a PenTile™ structure. In this case, subpixels PX2*a* and PX2*b* included in the second subpixels PX2 may generate light of a second wavelength band (e.g., green-based visible light).

For example, third subpixels PX3 may refer to subpixels electrically connected to the third data line DL3 or arranged along a third column. For example, the third subpixels PX3 may refer to subpixels included in the third subpixel group PG3. For example, the third subpixels PX3 may be subpixels for emitting light of one of three primary colors of light, or may be subpixels for emitting red-based light or blue-based light.

As described above, the example shown in FIG. 8 may be a PenTile™ structure. In this case, a 3a-th subpixel PX3*a* among the third subpixels PX3 may generate the light of the third wavelength band (e.g., the other of red-based visible light and blue-based visible light). A 3b-th subpixel PX3*b* among the third subpixels PX3 may generate the light of the first wavelength band (e.g., one of red-based visible light and blue-based visible light). For example, subpixels of the third subpixel group PG3 connected to odd-numbered gate lines may generate the light of the third wavelength band, and subpixels of the third subpixel group PG3 connected to even-numbered gate lines may generate the light of the first wavelength band.

For example, the fourth subpixels PX4 may refer to subpixels electrically connected to the fourth data line DL4 or arranged along a fourth column. For example, fourth subpixels PX4 may refer to subpixels included in the fourth subpixel group PG4. For example, the fourth subpixels PX4 may be subpixels for emitting light of one of the three primary colors of light (e.g., green-based light).

As described above, the example shown in FIG. 8 may be a PenTile™ structure. In this case, subpixels PX4*a* and PX4*b* included in the fourth subpixels PX4 may generate the light of the second wavelength band (e.g., green-based visible light).

According to an embodiment, the first switch SW1 may be a component for selectively transmitting the first data signal DATA1 to the first data line DL1. The second switch SW2 may be a component for selectively transmitting the second data signal DATA2 to the second data line DL2.

Because the third data line DL3 is not connected to a separate switch, the first data signal DATA1 may be completely transmitted to the third subpixel group PG3.

In this specification, completely transmitting a data signal may refer to not selectively transmitting a portion of the data signal by using a switch, a thin-film transistor, etc. In other words, completely transmitting a data signal may refer to transmitting the original data signal without changes.

According to an embodiment, the display apparatus 11 may further include the data driver 150 that generates a first data signal DATA1, and may further include a first output line OL1 that receives the first data signal DATA1 from the data driver 150 and transmits the first data signal DATA1 to the first data line DL1 and the third data line DL3. The first data signal DATA1 may include the data signal A D_A of the first section N1 and the data signal B D_B of the second section N2, and the second section N2 may be a section immediately following the first section N1.

According to an embodiment, the first switch SW1 may electrically connect the first output line OL1 to the first data line DL1.

According to an embodiment, the first switch SW1 may be turned on or off according to the first control signal CLA, and the data signal A D_A of the first data signal DATA1 may be transmitted to the first data line DL1 when the first switch SW1 is turned on. To this end, the first switch SW1 may be turned on in the first section N1.

According to an embodiment, the data signal B D_B of the first data signal DATA1 may not be transmitted to the first data line DL1 when the first switch SW1 is turned off. To this end, the first switch SW1 may be turned off in the second section N2.

According to an embodiment, the first data signal DATA1 may include the data signal A D_A for the first section N1 and the data signal B D_B for the second section N2.

According to an embodiment, the first output line OL1 and the third data line DL3 may be directly connected to each other, and the first data signal DATA1 may be completely transmitted from the first output line OL1 to the third data line DL3.

According to an embodiment, each of the third subpixels PX3 of the third subpixel group PG3 may include to the storage capacitor Cst of FIG. 2 or FIG. 3, and the first data signal DATA1 may be written to the storage capacitor Cst included in each of the third subpixels PX3.

According to an embodiment, the data signal B D_B may be written to the storage capacitor Cst included in each of the third subpixels PX3 after the data signal A D_A is written (e.g., sequentially). As a result, the data signal B D_B may be measured in the storage capacitor Cst included in each of the third subpixels PX3 after the second section N2 of FIG. 7.

According to an embodiment, a signal measured from the storage capacitor Cst included in each of the third subpixels PX3 in the first section N1 of FIG. 7 may be the data signal A D_A.

According to an embodiment, a signal measured from the storage capacitor Cst included in each of the third subpixels PX3 in the second section N2 right after the first section N1 may be the data signal B D_B.

According to an embodiment, the plurality of subpixel groups may further include a second subpixel group PG2 including second subpixels PX2 and a fourth subpixel group PG4 including fourth subpixels PX4.

The display apparatus 11 may further include the second data line DL2 for transmitting the second data signal DATA2 to the second subpixel group PG2, the fourth data line DL4 for transmitting the second data signal DATA2 to the fourth subpixel group PG4, and the second switch SW2 electrically connected to the second data line DL2.

According to an embodiment, the display apparatus 11 may further include the data driver 150 that generates the second data signal DATA2, and may further include a second output line OL2 that receives the second data signal DATA2 from the data driver 150 and transmits the second data signal DATA2 to the second data line DL2 and the fourth data line DL4.

According to an embodiment, the second switch SW2 may electrically connect the second output line OL2 to the second data line DL2.

According to an embodiment, the second switch SW2 may be turned on or off according to the first control signal CLA, and the second data signal DATA2 may be transmitted to the second data line DL2 when the second switch SW2 is turned on.

According to an embodiment, the second data signal DATA2 may be completely transmitted to the fourth data line DL4.

According to an embodiment, the substrate 200 may include the display area DA and the peripheral area PA around the display area DA, and the peripheral area PA (or the subarea PA') may include an area (for example, A1-1 of FIG. 8) where the second data line DL2 and the third data line DL3 intersect each other on a plan view. In addition, other several data lines may intersect each other on the plan view.

When the data lines DL1 through DL4 are arranged vertically adjacent to each other within a certain distance even when being spaced apart from each other vertically on a cross-sectional view, the data lines DL1 through DL4 crossing each other vertically may cause signal interference between each other. To prevent this signal interference, a separate shielding layer may be disposed between the data lines DL1 through DL4 crossing each other vertically. This will be described in detail later.

According to an embodiment, the second switch SW2 may be turned on or off according to the first control signal CLA, and the data signal A D_A of the second data signal DATA2 may be transmitted to the second data line DL2 when the second switch SW2 is turned on. To this end, the second switch SW2 may be turned on in the first section N1.

According to an embodiment, the data signal B D_B of the second data signal DATA2 may not be transmitted to the second data line DL2 when the second switch SW2 is turned off. To this end, the second switch SW2 may be turned off in the second section N2.

According to an embodiment, the second data signal DATA2 may include the data signal A D_A for the first section N1 and the data signal B D_B for the second section N2.

According to an embodiment, the second output line OL2 and the fourth data line DL4 may be directly connected to each other, and the second data signal DATA2 may be completely transmitted from the second output line OL2 to the fourth data line DL4.

According to an embodiment, each of the fourth subpixels PX4 of the fourth subpixel group PG4 may include the storage capacitor Cst of FIG. 2 or FIG. 3, and the second data signal DATA2 may be written to the storage capacitor Cst included in each of the fourth subpixels PX4.

According to an embodiment, the data signal B D_B may be written to the storage capacitor Cst included in each of the fourth subpixels PX4 after the data signal A D_A is written (e.g., sequentially). As a result, the data signal B D_B may be measured in the storage capacitor Cst included in each of the fourth subpixels PX4 after the second section N2 of FIG. 7.

According to an embodiment, a signal measured from the storage capacitor Cst included in each of the fourth subpixels PX4 in the first section N1 of FIG. 7 may be the data signal A D_A.

According to an embodiment, a signal measured from the storage capacitor Cst included in each of the fourth subpixels PX4 in the second section N2 right after the first section N1 may be the data signal B D_B.

As illustrated in FIG. 8, the display apparatus 11 having a PenTile™ structure may include pixels arranged along the first data line DL1 capable of implementing two colors and the third data line DL3 capable of implementing one color. There may be one demultiplexer (e.g., the first demultiplexer DMX1) corresponding to the pixels arranged along the first data line DL1 and the third data line DL3.

In this way, in the case of the PenTile™ structure, three colors of RGB may be implemented based on two columns, and the display apparatus 11 of FIG. 8 may include one demultiplexer for every two columns in which three colors are implemented.

Figure 9:
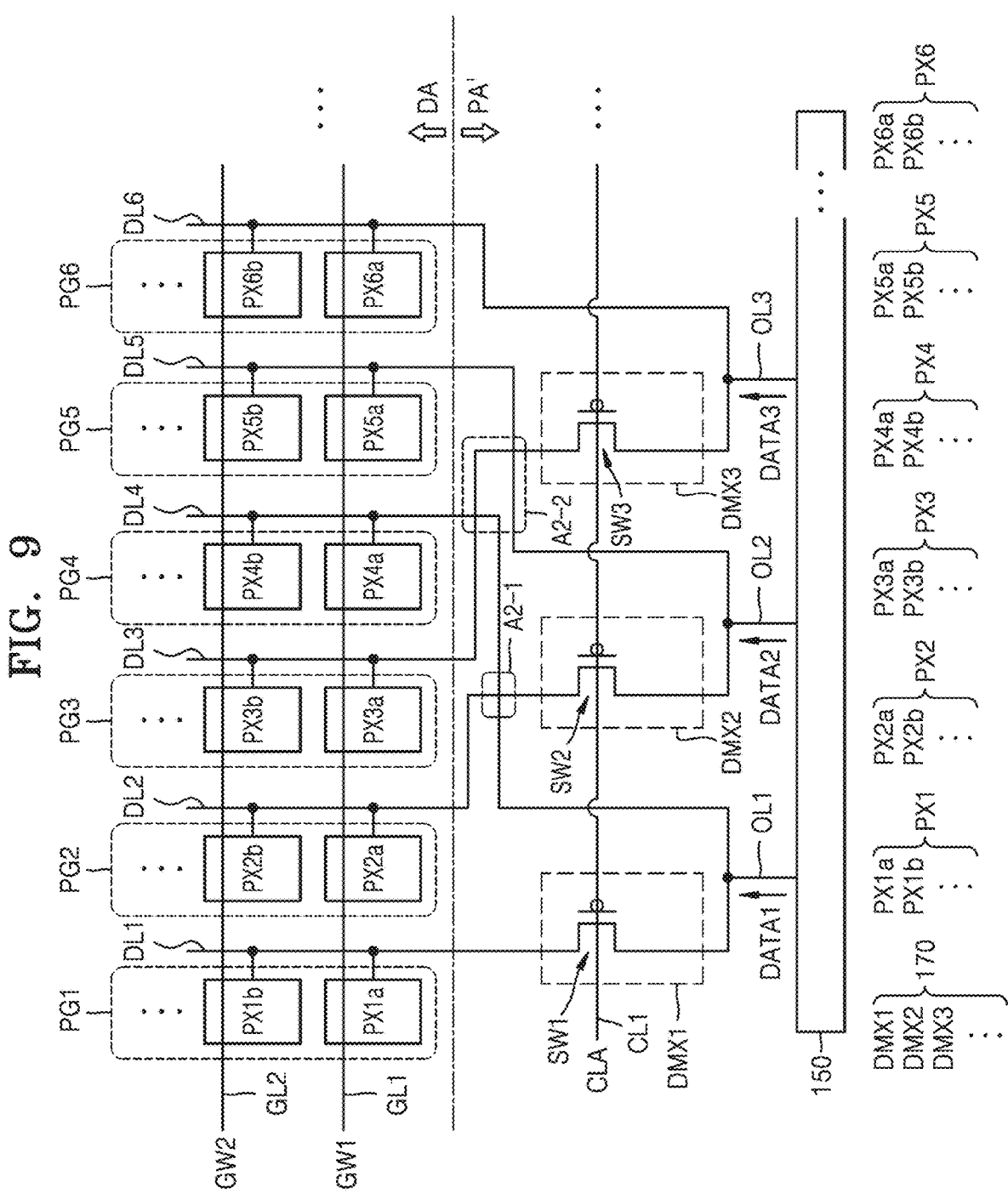
FIG. 9 is a conceptual diagram schematically illustrating another example of the respective portions of the subarea and the display area of FIG. 1.

FIG. 9 is a conceptual diagram schematically illustrating another example of the respective portions of the subarea PA' and the display area DA of FIG. 1.

FIG. 9 illustrates first, second, third, fourth, fifth, and sixth subpixel groups PG1, PG2, PG3, PG4, PG5, and PG6, first, second, third, fourth, fifth, and sixth data lines DL1, DL2, DL3, DL4, DL5, and DL6, and first and second gate lines GL1 and GL2, and the other subpixel groups, the other data lines, and the other gate lines are omitted for convenience of explanation. Those skilled in the art may clearly understand the omitted components based solely on the descriptions given herein.

As illustrated in FIG. 9, a plurality of subpixels may be arranged in the display area DA. A plurality of subpixel groups including the first through sixth subpixel groups PG1 through PG6 may be arranged in the display area DA. For example, each subpixel group may be defined based on whether it shares the same data line.

As illustrated in FIG. 9, a plurality of switches, namely, first, second, and third switches SW1, SW2, and SW3, may be arranged in one portion of the subarea PA'. As a result, the first through sixth data lines DL1 through DL6 may have various arrangement forms in order to transmit data signals to subpixel groups corresponding to the data signals, and the arrangement form illustrated in FIG. 9 is merely an example.

When the layout of the first through sixth data lines DL1 through DL6 is designed, areas A2-1 and A2-2 of FIG. 9 where the first through sixth data lines DL1 through DL6 intersect each other may occur. As the first through third switches SW1 through SW3 are arranged in one area, some of the first through sixth data lines DL1 through DL6 may cross each other in a plan view. For reference, respective locations of the areas A2-1 and A2-2 where the first through sixth data lines DL1 through DL6 intersect each other, illustrated in FIG. 9, are only an example, and various modifications may exist.

Some of the first through sixth data lines DL1 through DL6 may intersect each other in a plan view. In other words, some of the first through sixth data lines DL1 through DL6 may be spaced apart from each other vertically in a cross-sectional view, and, as a result, some of the first through sixth data lines DL1 through DL6 may not be electrically connected to each other.

When the first through sixth data lines DL1 through DL6 are arranged vertically adjacent to each other within a certain distance even when being spaced apart from each other vertically on a cross-sectional view, the first through sixth data lines DL1 through DL6 crossing each other vertically may cause signal interference between each other. To prevent this signal interference, a separate shielding layer may be disposed between the first through sixth data lines DL1 through DL6 crossing each other vertically. This will be described in detail later.

For example, a structure in which the plurality of subpixels are arranged in FIG. 9 may be a stripe structure. Accordingly, the first subpixel group PG1 and the fourth subpixel group PG4 may receive data signals from the same output line, the second subpixel group PG2 and the fifth subpixel group PG5 may receive data signals from the same output line, and the third subpixel group PG3 and the sixth subpixel group PG6 may receive data signals from the same output line. For example, a k-th subpixel group and a (k+3)th subpixel group may receive data signals from the same output line (where k is a natural number greater than or equal to 1).

Referring to FIGS. 6, 7, and 9, the display apparatus 11 according to an embodiment may include the substrate 200, and the first through sixth subpixel groups PG1 through PG6 are disposed on the substrate 200 and include the first subpixel group PG1 including first subpixels PX1 and the second subpixel group PG2 including second subpixels PX2.

As described above, the example shown in FIG. 9 may be a stripe structure. In this case, the first subpixels PX1 (e.g., a 1a-th subpixel PX1$a$ and a 1b-th subpixel PX1$b$) may generate the light of the first wavelength band (e.g., red-based visible light).

The second subpixels PX2 (e.g., a 2a-th subpixel PX2$a$ and a 2b-th subpixel PX2$b$) may generate the light of the second wavelength band (e.g., green-based visible light).

The third subpixels PX3 (e.g., a 3a-th subpixel PX3$a$ and a 3b-th subpixel PX3$b$) may generate the light of the third wavelength band (e.g., blue-based visible light).

The fourth subpixels PX4 (e.g., a 4a-th subpixel PX4$a$ and a 4b-th subpixel PX4$b$) may generate the light of the first wavelength band (e.g., red-based visible light).

The fifth subpixels PX5 (e.g., a 5a-th subpixel PX5$a$ and a 5b-th subpixel PX5$b$) may generate the light of the second wavelength band (e.g., green-based visible light).

The sixth subpixels PX6 (e.g., a 6a-th subpixel PX6*a* and a 6b-th subpixel PX6*b*) may generate the light of the third wavelength band (e.g., blue-based visible light).

In addition, in the stripe structure, k-th subpixels may generate visible light of the first wavelength band, (k+1)th subpixels may generate visible light of the second wavelength band, and (k+2)th subpixels may generate visible light of the third wavelength band.

According to an embodiment, the first switch SW1 may be a component for selectively transmitting a first data signal DATA1 to the first data line DL1. The second switch SW2 may be a component for selectively transmitting a second data signal DATA2 to the second data line DL2. The third switch SW3 may be a component for selectively transmitting a third data signal DATA3 to the third data line DL3.

Because the fourth data line DL4 is not connected to a separate switch, the first data signal DATA1 may be completely transmitted to the fourth subpixel group PG4. Because the fifth data line DL5 is not connected to a separate switch, the second data signal DATA2 may be completely transmitted to the fifth subpixel group PG5. Because the sixth data line DL6 is not connected to a separate switch, the third data signal DATA3 may be completely transmitted to the sixth subpixel group PG6.

In this way, a k-th switch may be a component for selectively transmitting a k-th data signal to a k-th data line. A (k+1)th switch may be a component for selectively transmitting a (k+1)th data signal to a (k+1)th data line. A (k+2)th switch may be a component for selectively transmitting a (k+2)th data signal to a (k+2)th data line.

Because a (k+3)th data line is not connected to a separate switch, a (k+3)th data signal may be completely transmitted to a (k+3)th subpixel group. Because a (k+4)th data line is not connected to a separate switch, a (k+4)th data signal may be completely transmitted to a (k+4)th subpixel group. Because a (k+5)th data line is not connected to a separate switch, a (k+5)th data signal may be completely transmitted to a (k+5)th subpixel group.

According to an embodiment, the display apparatus 11 may further include the data driver 150 that generates the first data signal DATA1, and may further include a first output line OL1 that receives the first data signal DATA1 from the data driver 150 and transmits the first data signal DATA1 to the first data line DL1 and the fourth data line DL4.

According to an embodiment, the first switch SW1 may electrically connect the first output line OL1 to the first data line DL1.

According to an embodiment, the first switch SW1 may be turned on or off according to the first control signal CLA, and the data signal A D_A of the first data signal DATA1 may be transmitted to the first data line DL1 when the first switch SW1 is turned on.

According to an embodiment, the first data signal DATA1 may include the data signal A D_A for the first section N1 of FIG. 7 and the data signal B D_B for the second section N2 of FIG. 7. The second data signal DATA2 and the third data signal DATA3 may also include data signals of the same type.

According to an embodiment, when the first switch SW1 is turned on in the first section N1, the data signal A D_A of the first section N1 may be transmitted to the first data line DL1.

According to an embodiment, when the first switch SW1 is turned off in the second section N2, the data signal B D_B of the second section N2 may not be transmitted to the first data line DL1.

According to an embodiment, the first output line OL1 and the fourth data line DL4 may be directly connected to each other, and the first data signal DATA1 (e.g., the data signal A D_A and the data signal B D_B) may be completely transmitted from the first output line OL1 to the fourth data line DL4.

According to an embodiment, each of the fourth subpixels PX4 may include the storage capacitor Cst of FIG. 2 or FIG. 3, and a data signal may be written to the storage capacitor Cst.

According to an embodiment, the data signal B D_B may be written to the storage capacitor Cst after the data signal A D_A is written (e.g., sequentially). As a result, the data signal B D_B may be measured in the storage capacitor Cst (after the second section N2 of FIG. 7).

According to an embodiment, the display apparatus 11 may further include the data driver 150 that generates the first through third data signals DATA1 through DATA3.

The display apparatus 11 may further include a second output line OL2 that receives the second data signal DATA2 from the data driver 150 and transmits the second data signal DATA2 to the second data line DL2 and the fifth data line DL5, and a third output line OL3 that receives the third data signal DATA3 from the data driver 150 and transmits the third data signal DATA3 to the third data line DL3 and the sixth data line DL6.

The display apparatus 11 may further include a k-th output line that receives the k-th data signal from the data driver 150 and transmits the k-th data signal to the k-th data line, etc.

According to an embodiment, the substrate 200 may include the display area DA and the peripheral area PA around the display area DA, and the peripheral area PA (or the subarea PA') may include an area (for example, A2-1 or A2-2 of FIG. 9) where data lines intersect each other on a plan view. In addition, other several data lines may intersect each other on the plan view.

When the data lines are arranged vertically adjacent to each other within a certain distance even when being spaced apart from each other vertically on a cross-sectional view, the data lines crossing each other vertically may cause signal interference between each other. To prevent this signal interference, a separate shielding layer may be disposed between the data lines crossing each other vertically. This will be described in detail later.

As illustrated in FIG. 9, each of the data lines of the display apparatus 11 having a stripe structure may be configured to implement one color. Accordingly, the display apparatus 11 having a stripe structure may include subpixels arranged in one column to implement one color.

In this way, in the case of the stripe structure, one color among red, green, and blue (RGB) may be implemented based on one column, and the display apparatus 111 of FIG. 9 may include one demultiplexer for every two columns in which one color is implemented.

Figure 10:
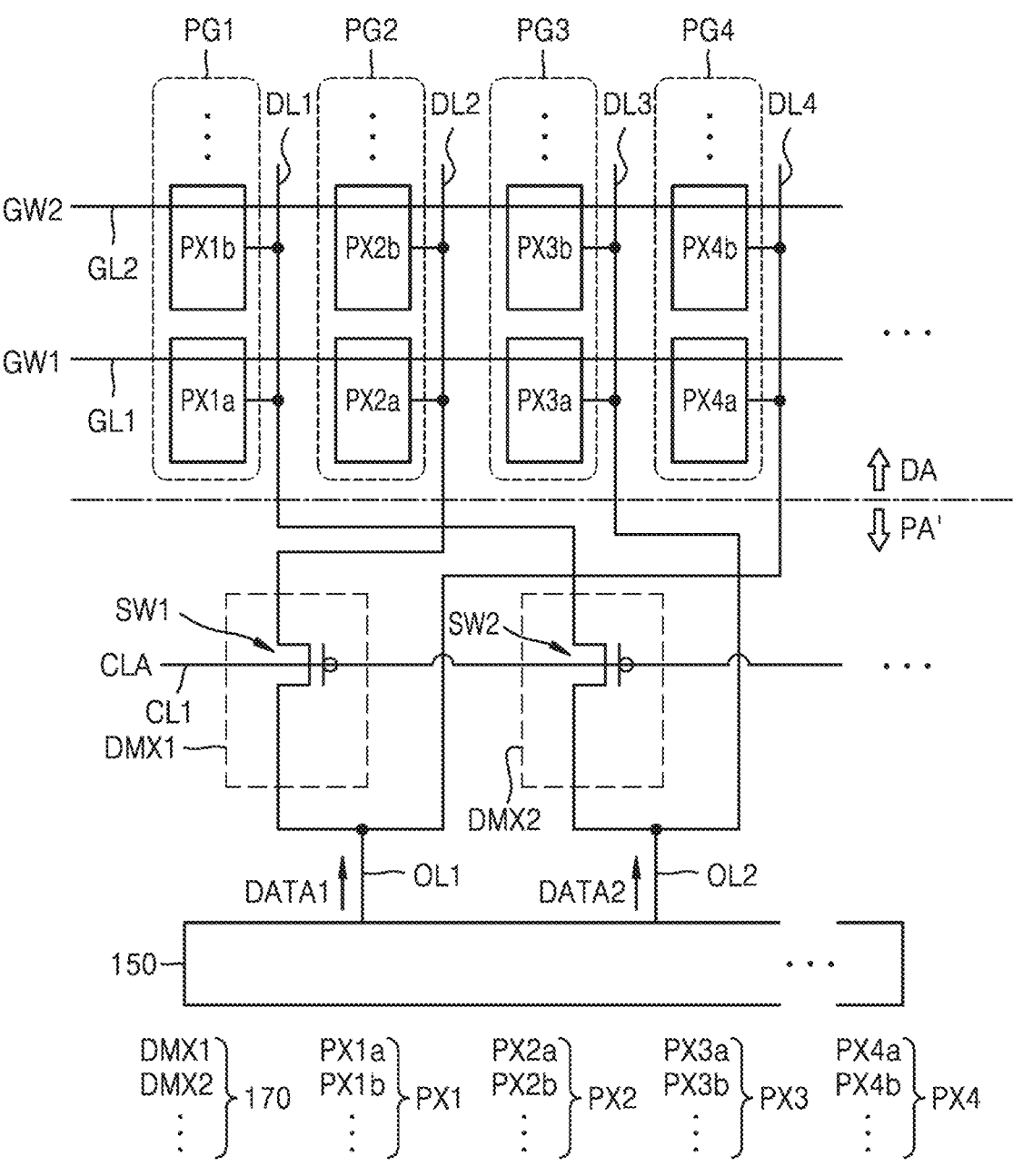
FIG. 10 is a conceptual diagram schematically illustrating an example of the respective portions of the subarea and the display area of FIG. 1.

FIG. 10 is a conceptual diagram schematically illustrating an example of the respective portions of the subarea PA' and the display area DA of FIG. 1. For reference, in the description of FIG. 10, the same or overlapping matters as those described above with reference to FIG. 8 may be omitted.

As illustrated in FIG. 10, the first subpixels PX1 included in the first subpixel group PG1 may be electrically connected to the first data line DL1, and the first data line DL1 may be electrically connected to the second switch SW2 or the second demultiplexer DMX2 including the second switch SW2.

The third subpixels PX3 included in the third subpixel group PG3 may be electrically connected to the third data line DL3, and the third data line DL3 may be electrically connected to the second output line OL2 without being electrically connected to the second switch SW2 or the second demultiplexer DMX2 including the second switch SW2.

The second subpixels PX2 included in the second subpixel group PG2 may be electrically connected to the second data line DL2, and the second data line DL2 may be electrically connected to the first switch SW1 or the first demultiplexer DMX1 including the first switch SW1.

The fourth subpixels PX4 included in the fourth subpixel group PG4 may be electrically connected to the fourth data line DL4, and the fourth data line DL4 may be electrically connected to the first output line OL1 without being electrically connected to the first switch SW1 or the first demultiplexer DMX1 including the first switch SW1.

In addition, other subpixel groups are electrically connected to corresponding data lines, and a description thereof is omitted. Those skilled in the art may clearly understand an electrical connection relationship between the other subpixel groups by using only the contents illustrated in FIG. 10.

Figure 11:
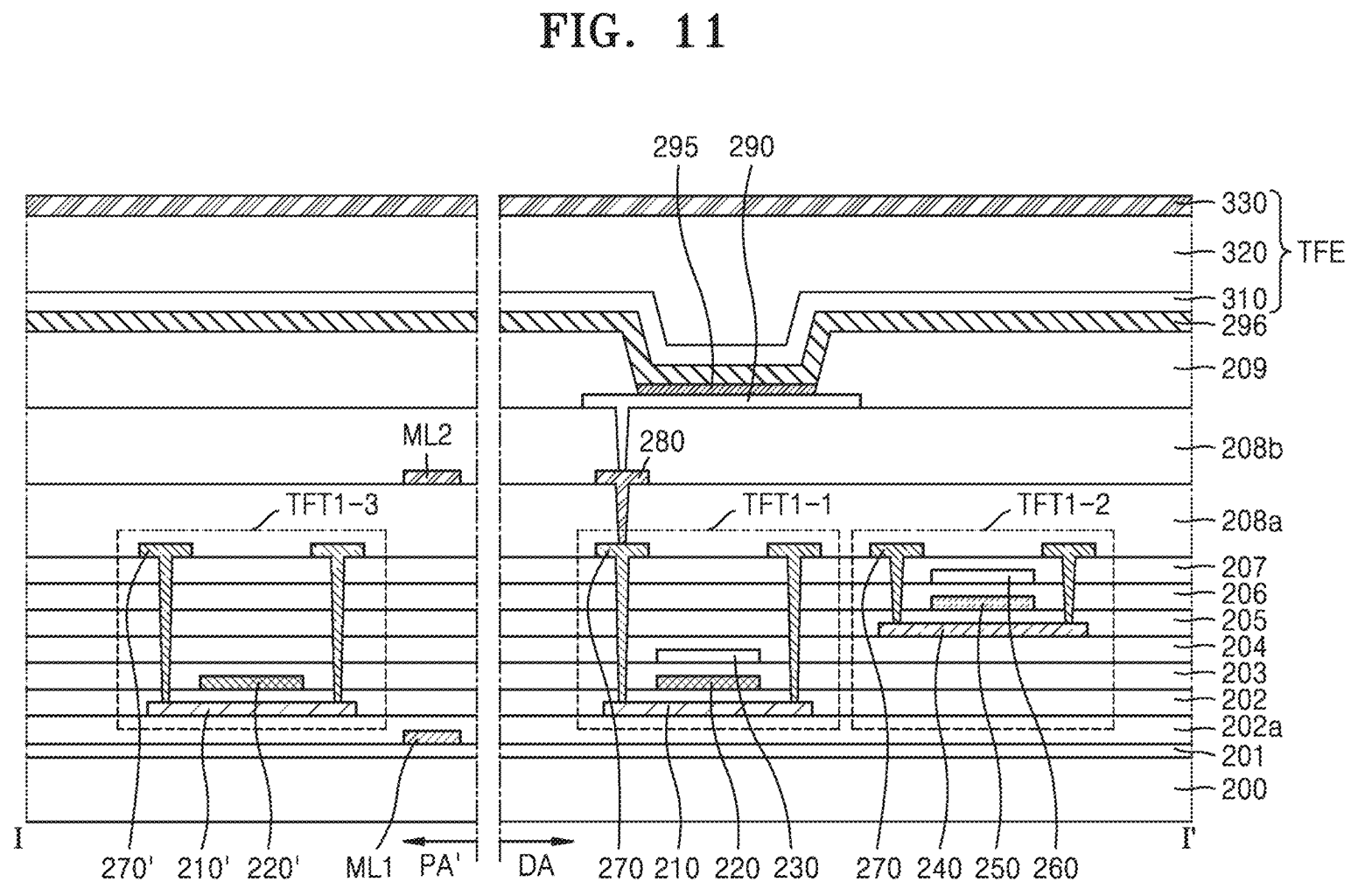

FIG. 11 is a schematic cross-sectional view taken along line I-I' of FIG. 1.

As illustrated in FIG. 11, a 1-3$^{rd}$ thin-film transistor TFT1-3 may be a component corresponding to a switch included in demultiplexers. A lower metal layer may be disposed below the 1-3$^{rd}$ thin-film transistor TFT1-3.

A lower metal layer ML1 may be disposed on a buffer layer 201 disposed on the substrate 200. The lower metal layer ML1 may include at least one metal from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

A first lower insulating layer 202a may be disposed on the lower metal layer ML1. The first lower insulating layer 202a, which is an inorganic insulating layer, may include an inorganic material, such as silicon oxide, silicon nitride, and/or silicon oxynitride.

The lower metal layer ML1 may be some of data lines. For example, one of two data lines connected to one output line may be the lower metal layer ML1.

An upper metal layer ML2 may be disposed on the same layer as a second conductive layer 280, and may include the same material as the material included in the second conductive layer 280. The upper metal layer ML2 may be others of the data lines. For example, the other of the two data lines connected to one output line may be the upper metal layer ML2.

As illustrated in FIG. 11, when one of the two data lines connected to one output line is the lower metal layer ML1, the lower metal layer ML1 may be spaced apart from the upper metal layer ML2 by a sufficient distance, so that the lower metal layer ML1 may not cause signal interference into the upper metal layer ML2 and may not receive signal interference from the upper metal layer ML2. As a result, even when a data line corresponding to the lower metal layer ML1 and a data line corresponding to the upper metal layer ML2 intersect each other in a plan view, a shielding layer to be described later may not be necessary.

FIGS. 12 through 15 are cross-sectional views schematically showing an example of one cross-section of areas where data lines intersect each other in FIGS. 8 and 9.

For reference, descriptions of FIGS. 12 through 15 that are the same as or overlap with those given above may be omitted.

The cross-sectional views of FIGS. 12 through 15 may be cross-sectional views taken in a specific direction with respect to the areas A1-1, A2-1, and A2-2 where the data lines intersect each other. However, for convenience of explanation, the cross-sectional views of FIGS. 12 through 15 are illustrated as cross-sectional views of the area A1-1 among the areas where the data lines intersect each other in FIG. 8. The cross-sectional views of FIGS. 12 through 15 may be obviously applied or utilized by those skilled in the art to the areas A2-1 and A2-2 where the data lines intersect each other in FIG. 9.

Figure 12:
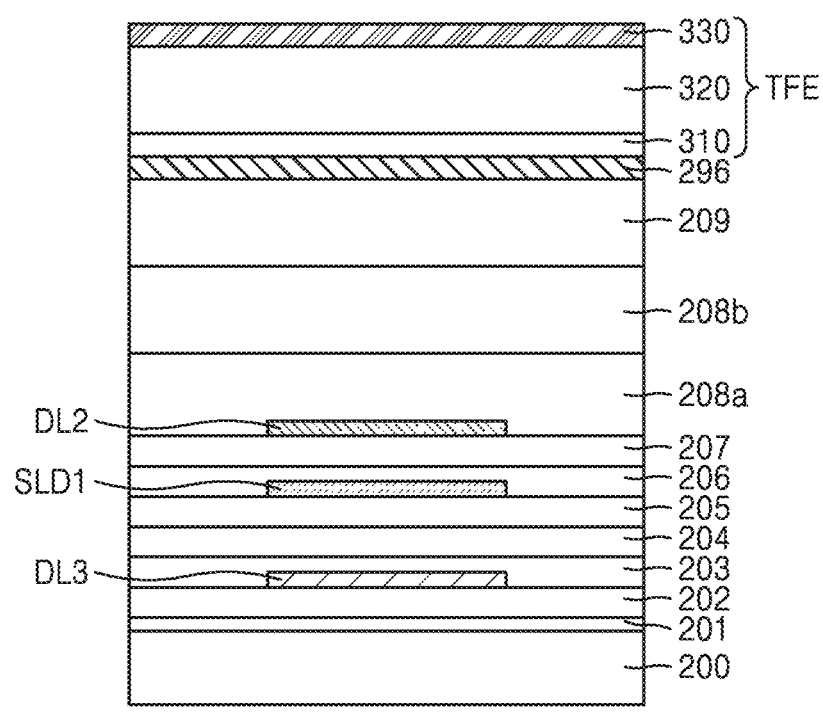
FIGS. 12, 13, 14, and 15 are cross-sectional views schematically showing an example of one cross-section of areas where data lines intersect each other in FIGS. 8 and 9.

Referring to FIGS. 8 and 12, the second data line DL2 and the third data line DL3 may intersect each other in a plan view. In a cross-sectional view, a first shielding layer SLD1 may be disposed between the second data line DL2 and the third data line DL3.

For example, the third data line DL3 not being connected to a second switch may be disposed below the second data line DL2. Similar to the third data line DL3, a data line that is not connected to a switch of a demultiplexer may be disposed below a data line that is connected to the switch, in a cross-sectional view.

For example, the third data line DL3 may include a conductive material, and may be disposed on the same layer as the layer on which the first gate layer 220 is disposed. The third data line DL3 may include the same material as that included in the first gate layer 220. The third data line DL3 may be formed simultaneously with the first gate layer 220. Similar to the third data line DL3, another data line that is directly connected to the switch of the demultiplexer may be disposed on the same layer as the layer on which the first gate layer 220 is disposed, and may include the same material as the material included in the first gate layer 220. The data line that is directly connected to the switch of the demultiplexer may be formed simultaneously with the first gate layer 220.

For example, the second data line DL2 may include a conductive material, and may be disposed on the same layer as the layer on which the first conductive layer 270 is disposed. The second data line DL2 may include the same material as that included in the first conductive layer 270. The second data line DL2 may be formed simultaneously with the first conductive layer 270. Similar to the second data line DL2, a data line that is not directly connected to the switch of the demultiplexer may be disposed on the same layer as the layer on which the first conductive layer 270 is disposed, and may include the same material as the material included in the first conductive layer 270. The data line that is not directly connected to the switch of the demultiplexer may be formed simultaneously with the first conductive layer 270.

For example, the first shielding layer SLD1 may be disposed between the second data line DL2 and the third data line DL3 in a cross-sectional view. The first shielding layer SLD1 may be a layer positioned or formed in areas where data lines intersect each other in a plan view, as in the area A1-1 where the data lines intersect each other in FIG. 8.

For example, in a cross-sectional view, the first shielding layer SLD1 may be disposed between the data line that is directly connected to the switch of the demultiplexer and the data line that is not directly connected to the switch of the demultiplexer. In a cross-sectional view, the first shielding layer SLD1 may be disposed on (e.g., over) a data line that is not connected to the switch of the demultiplexer. In a cross-sectional view, the first shielding layer SLD1 may be disposed below (e.g., under) the data line that is directly connected to the switch of the demultiplexer.

For example, the first shielding layer SLD1 may include a conductive material, and may be disposed on the same layer as the layer on which the third gate layer 250 is disposed. The first shielding layer SLD1 may include the same material as that included in the third gate layer 250. The first shielding layer SLD1 may be formed simultaneously with the third gate layer 250.

In some cases, the first shielding layer SLD1 may be electrically connected to the driving voltage line PL. For example, the first shielding layer SLD1 may be supplied with the first power supply voltage ELVDD or the second power supply voltage ELVSS. When a voltage of a certain magnitude is applied to the first shielding layer SLD1 or a ground voltage is connected thereto, a shielding effect of the first shielding layer SLD1 may be maximized.

According to an embodiment, the display apparatus may further include the first shielding layer SLD1 which is located in the one area A1-1, simultaneously overlaps the second data line DL2 and the third data line DL3 when viewed vertically with respect to the substrate 200, and is arranged between the second data line DL2 and the third data line DL3 in a cross-sectional view.

Figure 13:
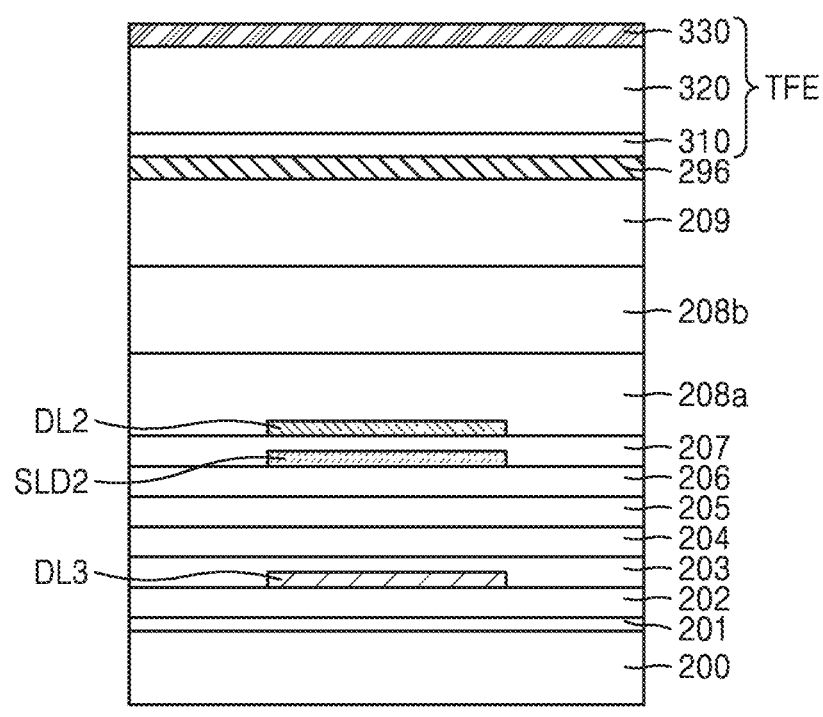

As illustrated in FIG. 13, a second shielding layer SLD2 may be disposed between the second data line DL2 and the third data line DL3 in a cross-sectional view. The second shielding layer SLD2 may be a layer positioned or formed in areas where data lines intersect each other in a plan view, as in the area A1-1 where the data lines intersect each other in FIG. 8.

For example, in a cross-sectional view, the second shielding layer SLD2 may be disposed between the data line that is directly connected to the switch of the demultiplexer and the data line that is not directly connected to the switch of the demultiplexer. In a cross-sectional view, the second shielding layer SLD2 may be disposed on (e.g., over) a data line that is connected to the switch of the demultiplexer. In a cross-sectional view, the second shielding layer SLD2 may be disposed below (e.g., under) a data line that is not directly connected to the switch of the demultiplexer.

For example, the second shielding layer SLD2 may include a conductive material, and may be disposed on the same layer as the layer on which the fourth gate layer 260 is disposed. The second shielding layer SLD2 may include the same material as that included in the fourth gate layer 260. The second shielding layer SLD2 may be formed simultaneously with the fourth gate layer 260. In some cases, the second shielding layer SLD2 may be electrically connected to the driving voltage line PL. For example, the second shielding layer SLD2 may be supplied with the first power supply voltage ELVDD or the second power supply voltage EVLSS. When a voltage of a certain magnitude is applied to the second shielding layer SLD2 or a ground voltage is connected thereto, a shielding effect of the second shielding layer SLD2 may be maximized.

Figure 14:
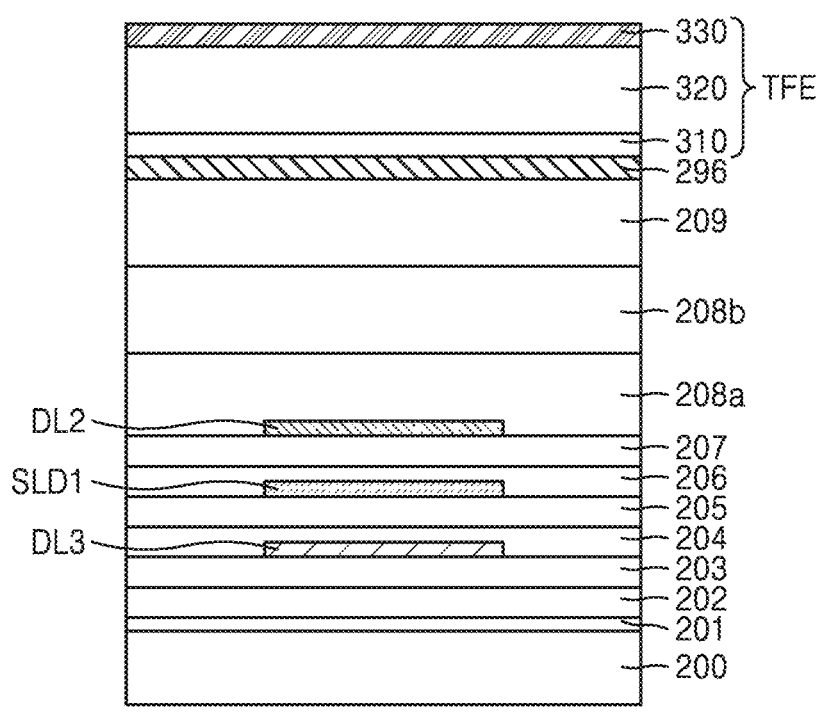

As illustrated in FIG. 14, the third data line DL3 may include a conductive material, and may be disposed on the same layer as the layer on which the second gate layer 230 is disposed. The third data line DL3 may include the same material as that included in the second gate layer 230. The third data line DL3 may be formed simultaneously with the second gate layer 230. Similar to the third data line DL3, another data line that is not directly connected to the switch of the demultiplexer may be disposed on the same layer as the layer on which the second gate layer 230 is disposed, and may include the same material as the material included in the second gate layer 230. Another data line that is not directly connected to the switch of the demultiplexer may be formed simultaneously with the second gate layer 230.

As illustrated in FIG. 14, the first shielding layer SLD1 may be arranged between the second data line DL2 and the third data line DL3 in a cross-sectional view, and a description of the first shielding layer SLD1 of FIG. 12 is replaced with that of the first shielding layer SLD1 of FIG. 14.

Figure 15:
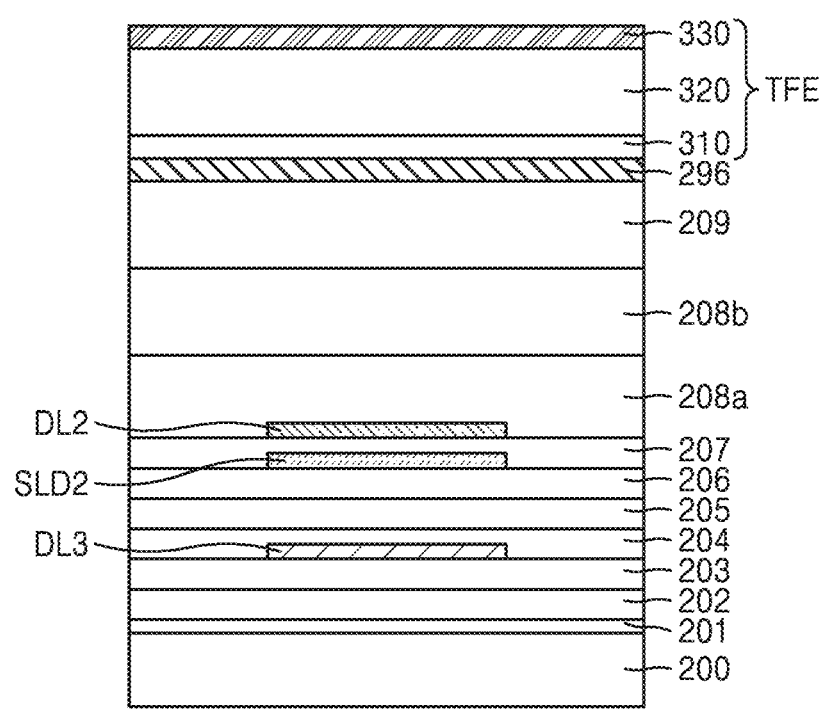

As illustrated in FIG. 15, the third data line DL3 may include a conductive material, and may be disposed on the same layer as the layer on which the second gate layer 230 is disposed. The description of the third data line DL3 of FIG. 15 is replaced with that of the third data line DL3 of FIG. 14.

As illustrated in FIG. 15, the second shielding layer SLD2 may be arranged between the second data line DL2 and the third data line DL3 in a cross-sectional view, and a description of the second shielding layer SLD2 of FIG. 13 is replaced with that of the second shielding layer SLD2 of FIG. 15.

FIG. 16 is a drawing illustrating an example of a demultiplexer of a display apparatus according to a comparative example, and FIG. 17 is a timing diagram showing signals provided to a pixel by using the demultiplexer of FIG. 16.

FIG. 16 is an example of a demultiplexer DMX that selectively connects a first output line OL1 to a pair of a first data line DL1 and a second data lines DL2 adjacent to each other. The demultiplexer DMX may include a first' switch SW1' and a second' switch SW2'. For convenience of explanation, a description will focus on the first data line DL1 and the second data line DL2. The first data line DL1 may be understood as an odd-numbered data line, and the second data line DL2 may be understood as an even-numbered data line. In this case, an example of a k-th output line may be understood as the first output line OL1 described above.

The first' switch SW1' may be included between the first output line OL1 and the first data line DL1. The first' switch SW1' may connect the first output line OL1 to the first data line DL1 according to the first control signal CLA, and may transmit the data signal DATA applied to the first output line OL1 to the first data line DL1.

The second' switch SW2' may be included between the first output line OL1 and the second data line DL2. The second' switch SW2' may connect the first output line OL1 to the second data line DL2 according to the second control signal CLB, and may transmit the data signal DATA applied to the first output line OL1 to the second data line DL2.

The distribution control signal CCS may include the first control signal CLA and the second control signal CLB. The first control signal CLA and the second control signal CLB may be applied alternately at different timings without overlapping.

A description of the subpixels of FIG. 16 may be replaced with the description of the subpixels of FIG. 6. FIG. 16 illustrates the first gate line GL1 arranged in a first row and the second gate line GL2 arranged in a second row. The first gate line GL1 may be understood as an odd-numbered gate line, and the second gate line GL2 may be understood as an even-numbered gate line.

As illustrated in FIG. 17, the first' switch SW1' and the second' switch SW2' may be turned on or off, respectively, according to the first control signal CLA and the second control signal CLB. For example, in the first section N1, the data signal DATA may be the data signal A D_A, and, in a second section N2, the data signal DATA may be the data signal B D_B.

For example, a voltage applied through the first gate line GL1 may be the first gate signal GW1, and a voltage applied through the second gate line GL2 may be the second gate signal GW2.

Referring to FIGS. 16 and 17, the first' switch SW1' and the second switch SW2' may be controlled by the distribution control signal CCS, the first control signal CLA, and the second control signal CLB, and, according to the first' switch SW1' and the second' switch SW2', the data signal A D_A may be transmitted to the first subpixel group PG1 in the first section N1, and the data signal B D_B may be transmitted to the second subpixel group PG2 in the second section N2. In this way, because the display apparatus 11 according to a comparative example needs to use both the first' switch SW1' and the second switch SW2', a relatively large area is needed. As a result, a bezel of the display apparatus 11 according to a comparative example has a wider area than a bezel of the display apparatus 11 according to an embodiment.

Figure 18:
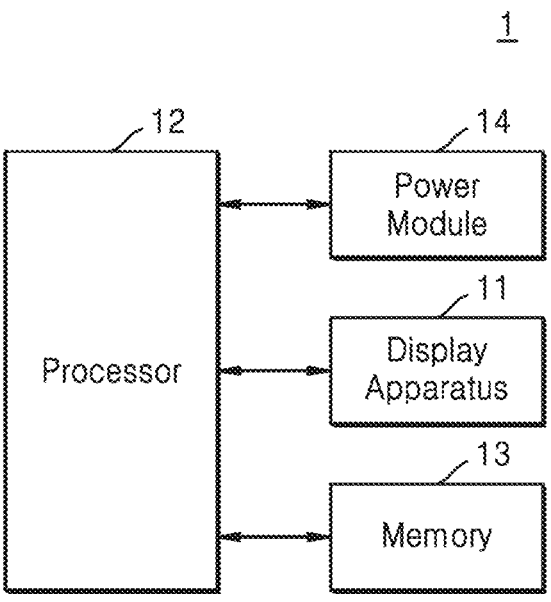
FIG. 18 is a block diagram of an electronic device.

FIG. 18 is a block diagram of an electronic device 1.

Referring to FIG. 18, the electronic device 1 may comprise the display apparatus 11, a processor 12, a memory 13, and a power module 14.

The processor 12 may comprise at least one of a central processing unit (CPU), an application processor (AP), a graphic processing unit (GPU), a communication processor (CP), an image signal processor (ISP), and a controller.

Data for operations of the processor 12 or the display apparatus 11 may be stored in the memory 13. When the processor 12 executes an application stored in the memory 13, image data signals and/or input control signals may be transferred to the display apparatus 11, and the display apparatus 11 may process the received signals to output image information through a display screen.

The power module 14 may comprise a power supply module such as a power adapter or a battery device, and a power conversion module that converts power supplied by the power supply module to generate power necessary for operation of the electronic device 1.

At least one of the components of the display apparatus 11 described above may be comprised in the electronic device 1 of the embodiments described above. Additionally, some individual modules functionally comprised in one module may be comprised in the display apparatus while others may be provided separately from the display apparatus.

The display apparatus 11 of FIG. 18 may comprise one of the examples of the display apparatus 11 described in FIGS. 1 to 17. For convenience of description, other descriptions are omitted, but one of ordinary skill in the art can easily and clearly understand the display apparatus 11 of FIG. 18 based on the descriptions of FIGS. 1 to 17.

In an embodiment, the electronic device 1 may comprise the memory 13 which stores data information, the processor 12 which generates data signals and/or control signals based on the data information, and the display apparatus 11 that operates based on the data signals and/or control signals.

Figure 19:
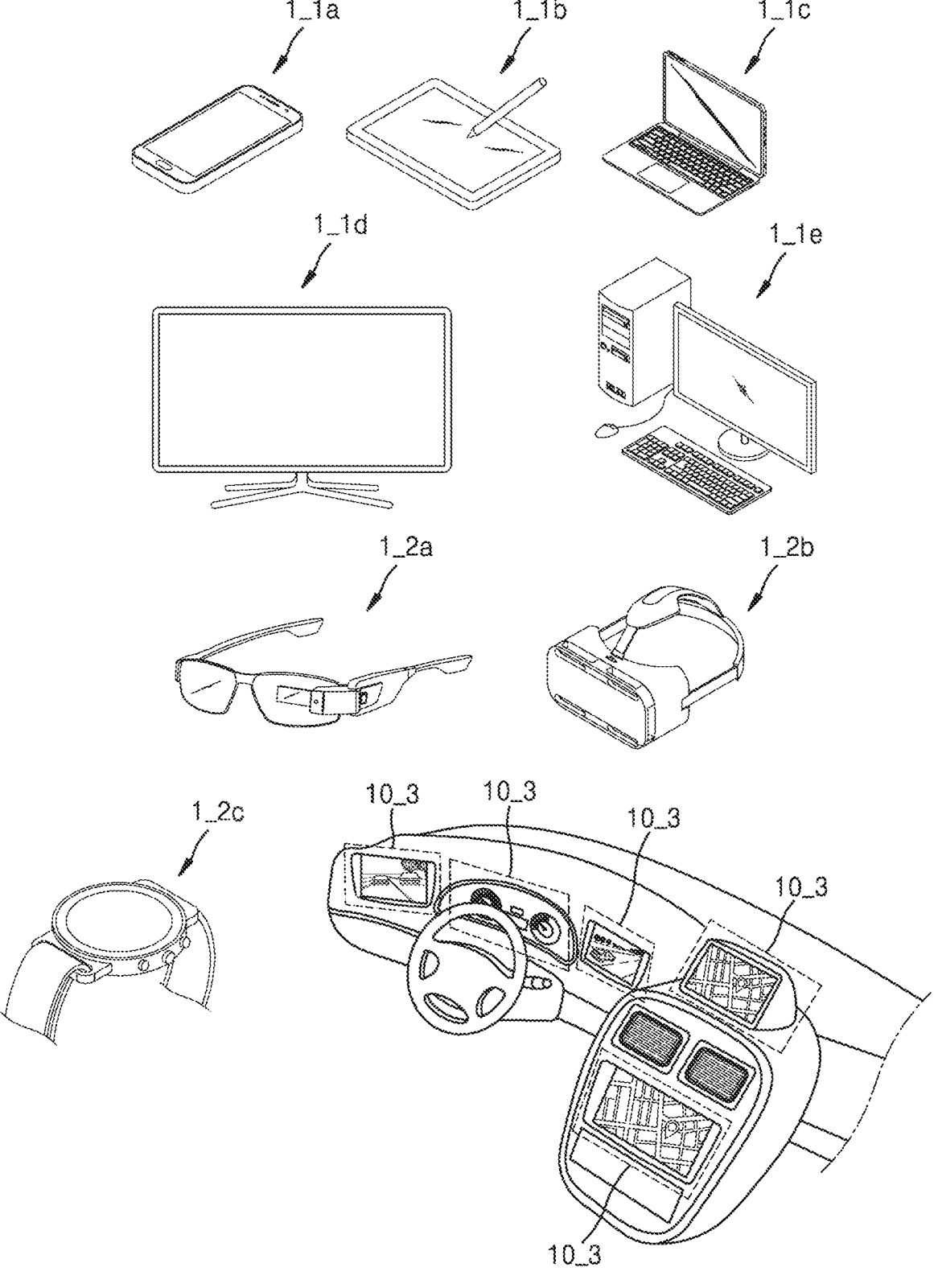
FIG. 19 shows schematic views of various electronic devices.

FIG. 19 shows schematic views of various electronic devices.

Referring to FIG. 19, the electronic device 1 may comprise not only electronic devices for displaying an image such as a smartphone 1_1a, a tablet PC 1_1b, a laptop 1_1c, a TV 1_1d, and a desktop monitor 1_1e, but also wearable electronic devices comprising display modules such as a smart glass 1_2a, a head-mounted display 1_2b, and a smart watch 1_2c, as well as a vehicle electronic device 10_3 comprising a display module such as an instrument panel, a center fascia, a dashboard equipped with a Center Information Display, and a rearview mirror display of an automobile.

According to an embodiment as described above, a display apparatus capable of reduced power consumption and having a reduced bezel may be realized. Of course, the scope of the disclosure is not limited thereto.

While some embodiments have been described, it will be readily apparent to those skilled in the art that various modifications may be made therein without departing from the spirit and scope of the disclosure. Unless otherwise stated, a description of a feature or aspect within each embodiment should generally be considered to be applicable to other similar features or aspects of other embodiments. Accordingly, as will be apparent to one of skill in the art, features or components described in connection with a particular embodiment may be combined with features or components described in connection with other embodiments. Therefore, the foregoing should not be construed as limited to the specific embodiments disclosed herein, but should be understood to be intended to be combined with or applied to other exemplary embodiments. Accordingly, the true technical protection scope of the disclosure should be determined by the technical spirit of the following claims.

What is claimed is:

1. A display apparatus comprising:
a substrate including a display area and a peripheral area around the display area;
a plurality of subpixel groups arranged on the substrate and including a first subpixel group including first subpixels, a second subpixel group including second subpixels, a third subpixel group including third subpixels and a fourth subpixel group including fourth subpixels;
a first data line configured to transmit a first data signal to the first subpixel group;
a second data line configured to transmit the first data signal to the second subpixel group;
a third data line configured to transmit a second data signal to the third subpixel group;
a fourth data line configured to transmit the second data signal to the fourth subpixel group;
a first switch electrically connected to the first data line and configured to selectively transmit the first data signal to the first data line;
a second switch electrically connected to the third data line;
a data driver configured to generate the second data signal;
a second output line configured to receive the second data signal from the data driver and transmit the second data signal to the third data line and the fourth data line, wherein,
the peripheral area includes an area where the second data line and the third data line intersect each other in a plan view; and
a first shielding layer located in the area, overlapping the second data line and the third data line when viewed vertically from the substrate, and arranged between the second data line and the third data line in a cross-sectional view.

2. The display apparatus of claim 1, wherein
the data driver is configured to generate the first data signal,
the display apparatus further comprising a first output line configured to receive the first data signal from the data driver and transmit the first data signal to the first data line and the second data line, wherein, the first output line and the second data line are directly connected to each other.

3. The display apparatus of claim 2, wherein the first switch electrically connects the first output line to the first data line.

4. The display apparatus of claim 3, wherein, the first switch is turned on or off according to a first control signal, and the first switch is turned on and the first data signal is transmitted to the first data line.

5. The display apparatus of claim 4, wherein the first data signal includes data signal A of a first section and data signal B of a second section following the first section.

6. The display apparatus of claim 5, wherein, the first switch is turned on, and the data signal A of the first section is transmitted to the first data line.

7. The display apparatus of claim 5, wherein, the first switch is turned off, and the first data signal is not transmitted to the first data line.

8. The display apparatus of claim 5, wherein, the first data signal is completely transmitted from the first output line to the second data line.

9. The display apparatus of claim 8, wherein, each of the second subpixels is electrically connected to a storage capacitor, and the first data signal is written to the storage capacitor.

10. The display apparatus of claim 9, wherein the data signal B is written to the storage capacitor after the data signal A is written to the storage capacitor.

11. The display apparatus of claim 9, wherein the first data signal is measured from the storage capacitor.

12. The display apparatus of claim 9, wherein a signal measured from the storage capacitor in the first section is the data signal A and a signal measured from the storage capacitor in the second section following the first section is the data signal B.

13. The display apparatus of claim 1, wherein the second switch electrically connects the second output line to the third data line.

14. The display apparatus of claim 13, wherein, the second switch is turned on or off according to a first control signal, and the second switch is turned on and the second data signal is transmitted to the third data line.

15. The display apparatus of claim 14, wherein the second data signal is completely transmitted to the fourth data line.

16. An electronic apparatus comprising:

a memory which stores data information;

a processor which generates data signals and/or control signals based on the data information; and a display apparatus which operates based on the data signals and/or the control signals, wherein the display apparatus comprising:

a substrate including a display area and a peripheral area around the display area;

a plurality of subpixel groups arranged on the substrate and including a first subpixel group including first subpixels, a second subpixel group including second subpixels, a third subpixel group including third subpixels and a fourth subpixel group including fourth subpixels;

a first data line configured to transmit a first data signal to the first subpixel group;

a second data line configured to transmit the first data signal to the second subpixel group;

a third data line configured to transmit a second data signal to the third subpixel group;

a fourth data line configured to transmit the second data signal to the fourth subpixel group;

a first switch electrically connected to the first data line and configured to selectively transmit the first data signal to the first data line;

a second switch electrically connected to the third data line;

a data driver configured to generate the first data signal and the second data signal; and a first output line configured to receive the first data signal from the data driver and transmit the first data signal to the first data line and the second data line;

a second output line configured to receive the second data signal from the data driver and transmit the second data signal to the third data line and the fourth data line, wherein, the peripheral area includes an area where the second data line and the third data line intersect each other in a plan view; and a first shielding layer located in the area, overlapping the second data line and the third data line when viewed vertically from the substrate, and arranged between the second data line and the third data line in a cross-sectional view, wherein, the first output line and the second data line are directly connected to each other.

* * * * *